(12) United States Patent
Yamauchi

(10) Patent No.: US 9,159,738 B2
(45) Date of Patent: Oct. 13, 2015

(54) SEMICONDUCTOR MEMORY DEVICE

(71) Applicant: Sharp Kabushiki Kaisha, Osaka-shi, Osaka (JP)

(72) Inventor: Yoshimitsu Yamauchi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 14/387,908

(22) PCT Filed: Feb. 14, 2013

(86) PCT No.: PCT/JP2013/053479
§ 371 (c)(1),
(2) Date: Sep. 25, 2014

(87) PCT Pub. No.: WO2013/153853
PCT Pub. Date: Oct. 17, 2013

(65) Prior Publication Data
US 2015/0043279 A1 Feb. 12, 2015

(30) Foreign Application Priority Data

Apr. 12, 2012 (JP) ................................. 2012-090906

(51) Int. Cl.
| | | |
|---|---|---|
| *G11C 11/24* | (2006.01) | |
| *H01L 27/115* | (2006.01) | |
| *G11C 11/403* | (2006.01) | |
| *G11C 11/4074* | (2006.01) | |
| *G11C 16/10* | (2006.01) | |
| *H01L 29/786* | (2006.01) | |
| *H01L 27/12* | (2006.01) | |
| *G11C 16/04* | (2006.01) | |

(52) U.S. Cl.
CPC ........ *H01L 27/11526* (2013.01); *G11C 11/403* (2013.01); *G11C 11/4074* (2013.01); *G11C 16/0408* (2013.01); *G11C 16/10* (2013.01); *H01L 27/115* (2013.01); *H01L 29/7869* (2013.01); *G11C 16/0433* (2013.01); *H01L 27/1156* (2013.01); *H01L 27/1225* (2013.01)

(58) Field of Classification Search
CPC ............................ G11C 16/0433; G11C 11/24
USPC .................. 365/149, 185.01; 257/43, 300
See application file for complete search history.

(56) References Cited

U.S. PATENT DOCUMENTS

| | | | | |
|---|---|---|---|---|
| 8,415,731 | B2* | 4/2013 | Yamazaki et al. | ............ 257/300 |
| 8,507,907 | B2* | 8/2013 | Takahashi et al. | ............... 257/43 |
| 8,582,348 | B2* | 11/2013 | Inoue et al. | .................... 365/149 |
| 8,634,228 | B2* | 1/2014 | Matsuzaki et al. | ............ 365/149 |

OTHER PUBLICATIONS

Matsuzaki et al., "1Mb Non-Volatile Random Access Memory Using Oxide Semiconductor", Memory Workshop (IMW), 2011 3rd IEEE International, May 2011, 4 pages.

* cited by examiner

*Primary Examiner* — Son Mai
(74) *Attorney, Agent, or Firm* — Keating & Bennett, LLP

(57) ABSTRACT

Provided is a semiconductor memory device including an oxide semiconductor insulated gate FET and having a capability to implement advanced performance without being affected by a variation in threshold voltage. A memory cell MC includes a memory node Nm formed at a connection point of a gate of a first transistor element T1, a source of a second transistor element T2, and one end of a capacitive element Cm, and a control node Nc formed at a connection point of a drain of the first transistor element T1 and a drain of the second transistor element T2. Each memory cell MC arranged in the same column includes the control node Nc connected to a shared first control line CL extending in a column direction, the first transistor element T1 having a source connected to a shared data signal line DL extending in the column direction, the second transistor element T2 having a gate connected to an individual first selection line WL, and the capacitive element Cm having the other end connected to an individual second selection line GL, and a switching element SE having one end connected to the first control line CL, and the other end connected to a voltage supply line VL is provided with respect to each first control line CL.

13 Claims, 13 Drawing Sheets

SEMICONDUCTOR MEMORY DEVICE

CROSS-REFERENCE TO RELATED APPLICATIONS

This application is a National Phase filing under 35 U.S.C. §371 of International Application No. PCT/JP2013/053479 filed on Feb. 14, 2013, and which claims priority to Japanese Patent Application No. 2012-090906 filed on Apr. 12, 2012.

TECHNICAL FIELD

The present invention relates to a semiconductor memory device including an oxide semiconductor insulated gate FET (Field Effect Transistor), and more particularly, to a semiconductor memory device suitable for storing multilevel information.

BACKGROUND ART

The semiconductor memory device is broadly divided into a RAM (Random Access Memory) and a ROM (Read Only Memory). As for the RAM, there is no limit on the number of writing operations, but it has the problem that retained data is lost at the time of power-supply disconnection, so that high power consumption is needed for retaining data during a standby period. Meanwhile, as for the ROM, data can be retained at the time of power-supply disconnection, but there is a limit on the number of writing operations, so that it cannot be used for a case where the writing operations are frequently needed. Therefore, research and development have been carried out for an ideal NVRAM (Nonvolatile Random Access Memory) through the ages because there is no limit on the number of writing operations and written data can be retained with super-low power consumption, but it has not been commercialized yet.

As for the insulated gate FET such as a MOSFET formed of oxide semiconductor having higher bandgap energy than silicon, it is expected that a leak current can be extremely small compared to a silicon MOSFET, so that development of the NVRAM using the oxide semiconductor MOSFET has been reported in Non Patent Document 1 described below.

As shown in FIG. 13, a memory cell disclosed in Non Patent Document 1 includes an ordinal silicon MOSFET 30, a capacitive element 31 having one end connected to a gate FN of the silicon MOSFET 30, and an oxide semiconductor MOSFET 32 in which one of a source and a drain is connected to the gate FN. The silicon MOSFET 30 and the capacitive element 31 simulatively form a silicon MOSFET (memory element) having a stacked gate structure formed of a floating gate and a control gate, and used in a memory cell in a conventional flash memory. According to the conventional flash memory, a charge is transferred from or to the floating gate through a thin gate insulating film by hot electron injection or FN tunneling, while according to the memory cell having the circuit configuration shown in FIG. 13, a charge is transferred through the oxide semiconductor MOSFET 32. As a result, it is not necessary to generate a high electric filed to transfer the charge from or to the floating gate FN, so that data can be written at low voltage and high speed, and there is no limit on the number of writing operations. In addition, the oxide semiconductor MOSFET 32 is extremely small in leak current, so that the charge stored in the floating gate FN can be held stably for a long time.

PRIOR ART DOCUMENT

Non Patent Document

Non Patent Document 1: Takanori Matsuzaki, et al., "1 Mb Non-Volatile Random Access Memory Using Oxide Semiconductor", Memory Workshop (IMW), 2011 3rd IEEE International, May 2011.

SUMMARY OF THE INVENTION

Problems to be Solved by the Invention

The memory cell described in Non Patent Document 1 is totally the same as the conventional flash memory cell in that information is stored by controlling a threshold voltage of the floating-gate MOSFET (memory element) formed of the silicon MOSFET 30 and the capacitive element 31 in which the other end of the capacitive element 31 serves as a control gate, based on an amount of the charges stored in the floating gate FN. Therefore, when there is a variation in the threshold voltage of the silicon MOSFET 30 itself among the memory cells, there is a variation in the threshold voltage of the memory element even when the memory cell has the same amount of charges stored in the floating gate FN, which causes a defect such as a reduction in operation margin. In addition, when the variation in the threshold voltage is great, it is necessary to prevent the threshold voltage from varying in a case where multilevel information having three or more values is stored in the one memory cell. In order to eliminate the variation in the threshold voltage with respect to the circuit, the conventional flash memory uses a method in which the charge is injected to the floating gate FN by stages, it is verified whether or not appropriate charge storing state is provided each time, and the charge is injected by the memory cell unit until the appropriate charge storing state is achieved. However, when the above writing method is employed in the NVRAM, a writing time is extremely longer than a reading time, which is the problem.

The present invention was made in view of the above problems, and it is an object of the present invention to provide a semiconductor memory device including an oxide semiconductor insulated gate FET and having capabilities to enlarge an operation margin, reduce an operation voltage, and implement advanced performance such as an increase in level of stored information without being affected by a variation in threshold voltage.

Means for Solving the Problem

To achieve the above object, the present invention provides, as first characteristics, a semiconductor memory device comprising a memory cell array in which a plurality of memory cells each having a first transistor element composed of an insulated gate FET, a second transistor element composed of an oxide semiconductor insulated gate FET, and a capacitive element are arranged at least in a column direction, wherein each of the memory cells includes a memory node formed at a connection point of a gate electrode of the first transistor element, a source electrode of the second transistor element, and one end of the capacitive element, and a control node formed at a connection point of a drain electrode of the first transistor element and a drain electrode of the second transistor element, each of the memory cells arranged in respective rows belonging to the same column includes the control node connected to a first control line shared in the same column and extending in the column direction, the first transistor element having a source electrode connected to a data signal line shared in the same column and extending in the column direction, the second transistor element having a gate electrode connected individually to a first selection line, and the capacitive element having the other end connected individually to a second selection line, a switching element having one end connected to the first control line, and the other end connected to a voltage supply line is provided with respect to each first control line, and the switching element is turned on to drive the first control line in an initialization operation to initialize a voltage state of the memory node, and in a reading operation to read the voltage state of the memory node, and turned off to set the first control line to a floating state in a writing operation to write a memory voltage in the memory node.

In addition, in the semiconductor memory device having the first characteristics, preferably, the memory cell array has the plurality of the memory cells in each of the column direction and a row direction, each of the memory cells arranged in the same row includes the second transistor element having the gate electrode connected to the first selection line shared in the same row and extending in the row direction, and the capacitive element having the other end connected to the second selection line shared in the same row and extending in the row direction, and the one end of the switching element which is one of the same number of switching elements as first control lines is connected to the first control line which is corresponding one of the first control lines, respectively.

In addition, in the semiconductor memory device having the first characteristics, preferably, the switching element is one of a third transistor element composed of an insulated gate FET having a gate electrode connected to the second control line, a drain electrode connected to the voltage supply line, and a source electrode connected to the first control line, a fourth transistor element composed of an insulated gate FET having a gate electrode and a drain electrode both connected to the voltage supply line, and a source electrode connected to the first control line, and a diode element in which one of an anode terminal and a cathode terminal is connected to the voltage supply line, and the other is connected to the first control line.

In addition, in the semiconductor memory device having the first characteristics, preferably, each of the first and second transistor elements is a thin film transistor element, or the first transistor element is a transistor element formed on a semiconductor substrate, and the second transistor element is a thin film transistor element formed so as to be stacked above the first transistor element.

In addition, in the semiconductor memory device having the first characteristics, the second transistor element is preferably made of oxide semiconductor of InGaZnO.

More preferably, as second characteristics, the semiconductor memory device having the first characteristics is configured so that, in the initialization operation, a first selection voltage and a second selection voltage are respectively applied to the first selection line and the second selection line connected to the memory cells in at least one selected row selected as a target of the initialization operation, to turn on the second transistor element, an initialization auxiliary voltage is applied to the data signal line connected to the memory cells selected as the target of the initialization operation to forcibly turn off the first transistor element, and a predetermined initialization voltage is written from the voltage supply line to the memory node of the memory cells selected as the target of the initialization operation through the switching element and the second transistor element both turned on.

More preferably, as third characteristics, the semiconductor memory device having the first or second characteristics is configured so that in the writing operation for at least one of the memory cells in which the voltage state of the memory node has been initialized, a first selection voltage and a second selection voltage are respectively applied to the first selection line and the second selection line connected to the memory cells in one selected row selected as a target of the writing operation, to turn on the first and second transistor elements, a first non-selection voltage and a second non-selection voltage are respectively applied to the first selection line and the second selection line connected to the memory cells in an unselected row not selected as the target of the writing operation, to turn off the first and second transistor elements, a writing voltage corresponding to data to be stored is individually applied to the data signal line connected to the memory cells in at least one selected column selected as the target of the writing operation, and the memory voltage having a constant relationship with the writing voltage is written from the data signal line connected to the memory cells in the selected column to the memory node of each of the memory cells selected as the target of the writing operation through the first and second transistor elements both turned on.

More preferably, as fourth characteristics, the semiconductor memory device having the third characteristics is configured so that a writing inhibition voltage is applied to the data signal line connected to the memory cells in an unselected column not selected as the target of the writing operation, to turn off the first transistor element.

More preferably, as fifth characteristics, the semiconductor memory device having one of the first to fourth characteristics is configured so that after the writing operation, a first non-selection voltage is applied to the first selection line to turn off the second transistor element, and set the memory node to a floating state, and the memory voltage written in the memory node is continuously held.

More preferably, as sixth characteristics, the semiconductor memory device having one of the first to fifth characteristics is configured so that in the reading operation, a first non-selection voltage is applied to the first selection lines in all of the rows to turn off the second transistor elements of the memory cells in the rows, the second selection voltage is applied to the second selection line connected to the memory cells in one selected row selected as a target of the reading operation, and the voltage state of the memory node of each of the memory cells in the selected row becomes the memory voltage written in the writing operation, a second non-selection voltage is applied to the second selection line connected to the memory cells in an unselected row not selected as the target of the reading operation, and the voltage state of the memory node of each of the memory cells not selected as the target of the reading operation is inactivated to forcibly turn off the first transistor element, and a reading voltage or a reading current corresponding to the voltage state of the memory node of each of the memory cells in the corresponding selected column in the selected row is outputted to the data signal line in at least one selected column selected as the target of the reading operation.

More preferably, as seventh characteristics, the semiconductor memory device having the sixth characteristics is configured so that a reading inhibition voltage to turn off the first transistor element is applied to the data signal line connected to the memory cells in an unselected column not selected as the target of the reading operation, or any voltage is not applied to the data signal line to set the first transistor element to the floating state for the memory cells in the unselected column.

In addition, the semiconductor memory device having one of the first to seventh characteristics preferably comprises a data signal line drive circuit for individually driving the data signal line; a first selection line drive circuit for individually driving the first selection line; a second selection line drive circuit for individually driving the second selection line; a switching element control circuit for turning on or off the switching element; and a reading circuit for detecting a reading voltage or a reading current outputted to the data signal line based on the memory voltage stored in the memory node.

Effects of the Invention

According to the semiconductor memory device having the above characteristics, the memory voltage having the constant relationship with the writing voltage inputted to the data signal line is stored in the memory node. More specifically, the switching element is turned on, and the second transistor element of the memory cell in the selected row is turned on to selectively initialize the memory node of that memory cell at the predetermined initialization voltage, and then the switching element is turned off, so that the drain electrode and the gate electrode of the first transistor element are connected through the second transistor element, and the first transistor element serves as a diode. In a case where a conductivity type of the first transistor element is an n type, the diode is provided such that an anode is connected to the memory node, and a cathode is connected to the data signal line, while in a case where the conductivity type of the first transistor element is a p type, the diode is provided such that an anode is connected to the data signal line, and a cathode is connected to the memory node. In either case, a turn-on voltage of the diode is equal to an absolute value of a threshold voltage of the first transistor element. Therefore, the initialization voltage is previously set such that the voltage difference between the initialization voltage and the writing voltage of the memory node is larger than the turn-on voltage of the diode regardless of the writing voltage. In this case, when the data signal line is driven at the writing voltage in the writing operation, and the diode is turned on, the voltage of the memory node of the memory cell in the selected row is reduced from the initialization voltage to the writing voltage until the diode is turned off in the case where the conductivity type of the first transistor element is the n type, while the voltage of the memory node of the memory cell in the selected row is increased from the initialization voltage to the writing voltage until the diode is turned off in the case where the conductivity type is the p type. As a result, in the writing operation, the memory voltage having the specific relationship with the writing voltage is stored in the memory node, and more specifically, in the case where the conductivity type of the first transistor element is the n type, the memory voltage is higher and in the case where the conductivity type of the first transistor element is the p type, the memory voltage is lower than the writing voltage by the threshold voltage of the first transistor element. Therefore, in the initialization operation and the writing operation, the memory voltage having the specific relationship with the writing voltage is stored in the memory node only by switching the on/off of the switching element.

After the memory voltage is stored in the memory node, the memory node is set to a floating state by turning off the second transistor element, so that the charge corresponding to the memory voltage can be continuously held. Here, since the second transistor element is the oxide semiconductor transistor whose leak current is extremely small compared to the silicon transistor, so that the charge corresponding to the memory voltage stored in the memory node can be held stably for a long time, and power consumption for holding the data can be considerably reduced, and as a result, it can be functioned as a nonvolatile memory.

Furthermore, in the reading operation, under the condition that the second transistor element is turned off and the memory node is maintained in the floating state, the switching element connected to the memory cell selected as a reading target through the first control line is turned on, and the second selection voltage is applied to the second selection line connected to the memory cell in the selected row selected as the reading target so that a voltage state of the memory node of the selected memory cell is returned to the state provided right after the memory voltage has been written in the writing operation. Thus, when a current is applied to the data signal line through the switching element and the first transistor element, the reading voltage or the reading current stored in the memory node and corresponding to the memory voltage can be outputted to the data signal line.

In the reading operation to output the reading voltage to the data signal line, the data signal line is previously set to the floating state so that its voltage level can be changed when the voltage is charged or discharged with the reading current flowing between the drain electrode and the source electrode of the first transistor element. Thus, when the voltage of the data signal line is charged or discharged to the same voltage level as the writing voltage in the writing operation, the voltage difference between the gate electrode (memory node) and the source electrode (data signal line) of the first transistor element becomes equal to an absolute value of the threshold voltage of the first transistor element, so that the first transistor element is cut off, and the charge or discharge is finished, and as a result, the reading voltage having the same voltage as the writing voltage is outputted to the data signal line.

Meanwhile, in the reading operation to output the reading current to the data signal line, when a bias condition of the first control line is adjusted so that the first transistor element may reach a saturation state in the reading operation, the reading current flowing between the drain electrode and the source electrode of the first transistor element can be a saturation current which is proportional to a square of the voltage difference between the voltage between the gate electrode and the source electrode, and the threshold voltage of the first transistor element. Here, the memory voltage stored in the memory node differs from the writing voltage applied in the writing operation by the absolute value of the threshold voltage of the first transistor element, so that the reading current is proportional to a square of a voltage difference between the writing voltage and the voltage applied to the data signal line in the reading operation. Thus, the reading current corresponding to the writing voltage, that is, corresponding to the information stored in the memory node can be outputted.

Here, it is to be noted that since the memory voltage stored in the memory node is higher or lower by the threshold voltage of the first transistor element in each memory cell, the variation in the threshold voltage of the first transistor element has been previously compensated, so that the reading voltage and the reading current outputted to the data signal line in the reading operation do not contain a voltage component and a current component which depend on the threshold voltage of the first transistor element, and they are not affected by the threshold voltage of the first transistor element. As a result, according to the semiconductor memory device having the above characteristics, it is possible to reduce a voltage gap among the writing voltages corresponding to the respective values of the multilevel information, so that the operation can be performed at lower voltage or when the operation is performed at the same voltage, the information can be further multilevel information.

In the case where the first and second transistor elements constituting the memory cell are each composed of the thin film transistor (TFT), the memory cell can be arranged on a panel of an active matrix type display panel including the TFT in a pixel. More specifically, it is possible to individually form the memory cell in each pixel and use the memory cell in storing a pixel voltage in each pixel, or it is possible to arrange the memory cells in the shape of a matrix as a memory cell array and place them in a periphery part of a pixel array to hold various data (image data, sense data of a touch panel, or the like).

Furthermore, in the case where the first and second transistor elements constituting the memory cell are each composed of the thin film transistor (TFT), the memory cell array can be formed by laminating it on an upper layer side of a logic circuit such as a CPU (central processing unit) or the like formed on a silicon substrate. That is, there is no need to separately provide a region to form the memory cell array, on the semiconductor substrate having the logic circuit, so that it is possible to form the semiconductor memory device three-dimensionally, on an existing logic circuit LSI.

Furthermore, when the first transistor element is formed on the semiconductor substrate such as a silicon substrate, and the second transistor element is stacked above the first transistor element and formed as the thin film transistor (TFT) in each memory cell, an occupied area in each memory cell can be considerably reduced, so that the semiconductor memory device can be reduced in size and increased in capacity.

DESCRIPTION OF EMBODIMENTS

Hereinafter, embodiments of the semiconductor memory device in the present invention will be described with reference to the drawings.

First Embodiment

In the first embodiment, a description will be given to a semiconductor memory device in the present invention (hereinafter, simply referred to as the memory device), and a circuit configuration of a memory cell used in the memory device.

Figure 1:
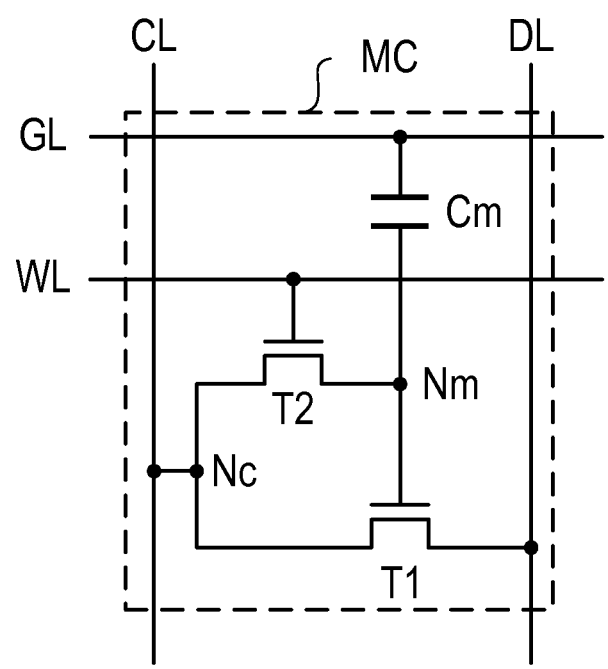
FIG. 1 is an equivalent circuit diagram showing a circuit configuration example of a memory cell used in a semiconductor memory device in the present invention.

FIG. 1 shows an equivalent circuit diagram of a memory cell MC. The memory cell MC is provided with a first transistor element T1 composed of an insulated gate FET, a second transistor element T2 composed of an oxide semiconductor insulated gate FET, and a capacitive element Cm. In this embodiment, it is assumed that the first transistor element T1 is an n-channel MOSFET formed on a silicon substrate, and the second transistor element T2 is an n-channel thin film transistor (TFT).

In addition, as shown in FIG. 1, in the memory cell MC, a memory node Nm is formed at a connection point of a gate electrode of the first transistor element T1, a source electrode of the second transistor element T2, and one end of the capacitive element Cm, and a control node Nc is formed at a connection point of a drain electrode of the first transistor element T1, and a drain electrode of the second transistor element T2.

A gate electrode of the second transistor element T2 is connected to a first word line WL (corresponding to a first selection line), the other end of the capacitive element Cm is connected to a second word line GL (corresponding to a second selection line), the control node Nc is connected a first control line CL, and a source electrode of the first transistor element T1 is connected to a data line DL (corresponding to a data signal line).

Figure 2:
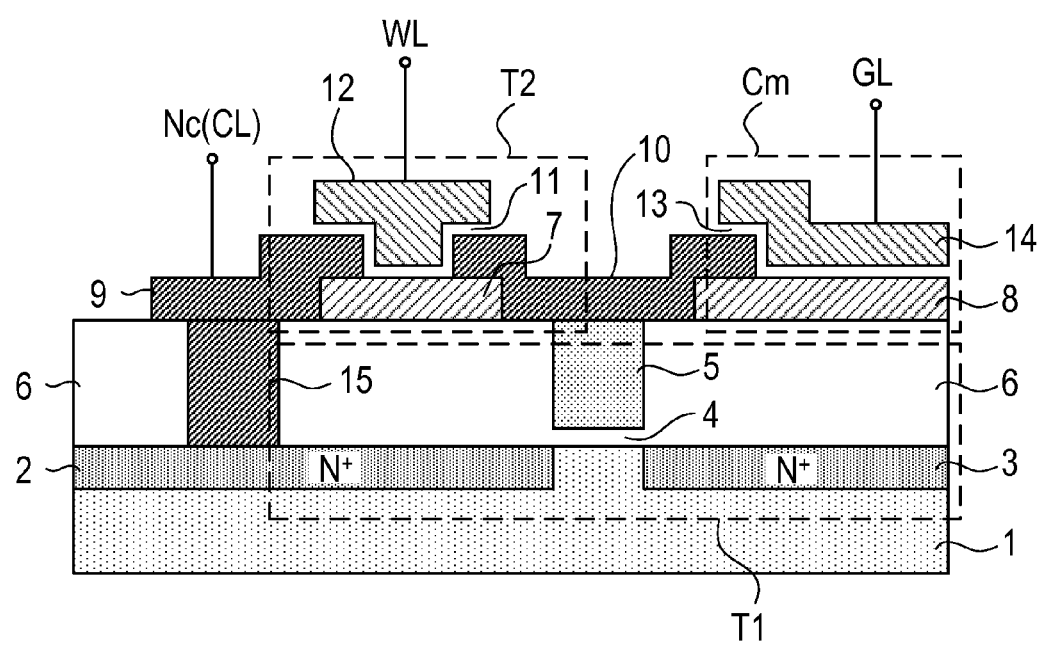
FIG. 2 is a cross-sectional view schematically showing one example of a cross-sectional structure of the memory cell shown in FIG. 1.

FIG. 2 schematically shows one example of a cross-sectional structure of the memory cell MC. In FIG. 2, essential parts are emphatically drawn to easily understand the cross-sectional structure, so that a dimension ratio of each part does not always coincide with a dimension ratio in an actual device. The first transistor element T1 is formed on a silicon substrate 1, as the n-channel MOSFET. The first transistor element T1 is provided with a drain region 2 and a source region 3 serving as n-type impurity regions, and a gate 5 composed of polycrystalline silicon and formed above a channel region provided between the drain region 2 and the source region 3, with a first gate insulating film 4 interposed between them. The first transistor element T1 is manufactured by a process of manufacturing a general silicon MOSFET.

An insulating film 6 is formed on each side of the gate 5 of the first transistor element T1 on a surface of the silicon substrate 1, and the second transistor element T2 and the capacitive element Cm are formed on the gate 5 and the insulating film 6. In this embodiment, the second transistor element T2 is the n-channel thin film transistor (TFT).

The second transistor element T2 is provided with a first active region (channel region) 7 composed of oxide semiconductor, a first metal electrode 9 (drain electrode) and a second metal electrode 10 (source region) respectively connected to ends of the first active region 7, and a gate 12 formed above the first active region 7 with a second gate insulating film 11 interposed between them. The capacitive element Cm is provided with the second metal electrode 10, a second active region 8 composed of oxide semiconductor and being in ohmic contact with the second metal electrode 10, and an electrode 14 composed of the same conductive material as that of the gate 12 and formed above the second active region 8 with a third gate insulating film 13 interposed between them. Furthermore, the second metal electrode 10 and the gate 5 of the first transistor element T1 are directly in ohmic contact with each other to form the memory node Nm. Furthermore, the first metal electrode 9 and the drain region 2 of the first transistor element T1 are electrically connected by a contact metal 15 filled in a through hole that penetrates the insulating film 6 to form the control node Nc.

In this embodiment, each of the first and second active regions 7 and 8 is composed of the oxide semiconductor of InGaZnO. In addition, each of the first and second metal electrodes 9 and 10 is composed of metal (such as Ti/Al—Si/Ti) which is in ohmic contact with InGaZnO and polycrystalline silicon. Each of the gate 12 and the electrode 14 is composed of conductive material such as Ti/Al—Si/Ti. Furthermore, the contact metal 15 is composed of metal (such as the same metal material as that of the first and second metal electrodes 9 and 10) which is in ohmic contact with the drain region 2 and the first metal electrode 9. The second transistor element T2 and the capacitive element Cm are manufactured by a low-temperature TFT manufacturing process.

In addition, the second transistor element T2 is the planar TFT in the cross-sectional view in FIG. 2, but it may be an inversely-staggered TFT, and the specific cross-sectional structure of the memory cell MC is not limited to that shown in FIG. 2.

Figure 3:
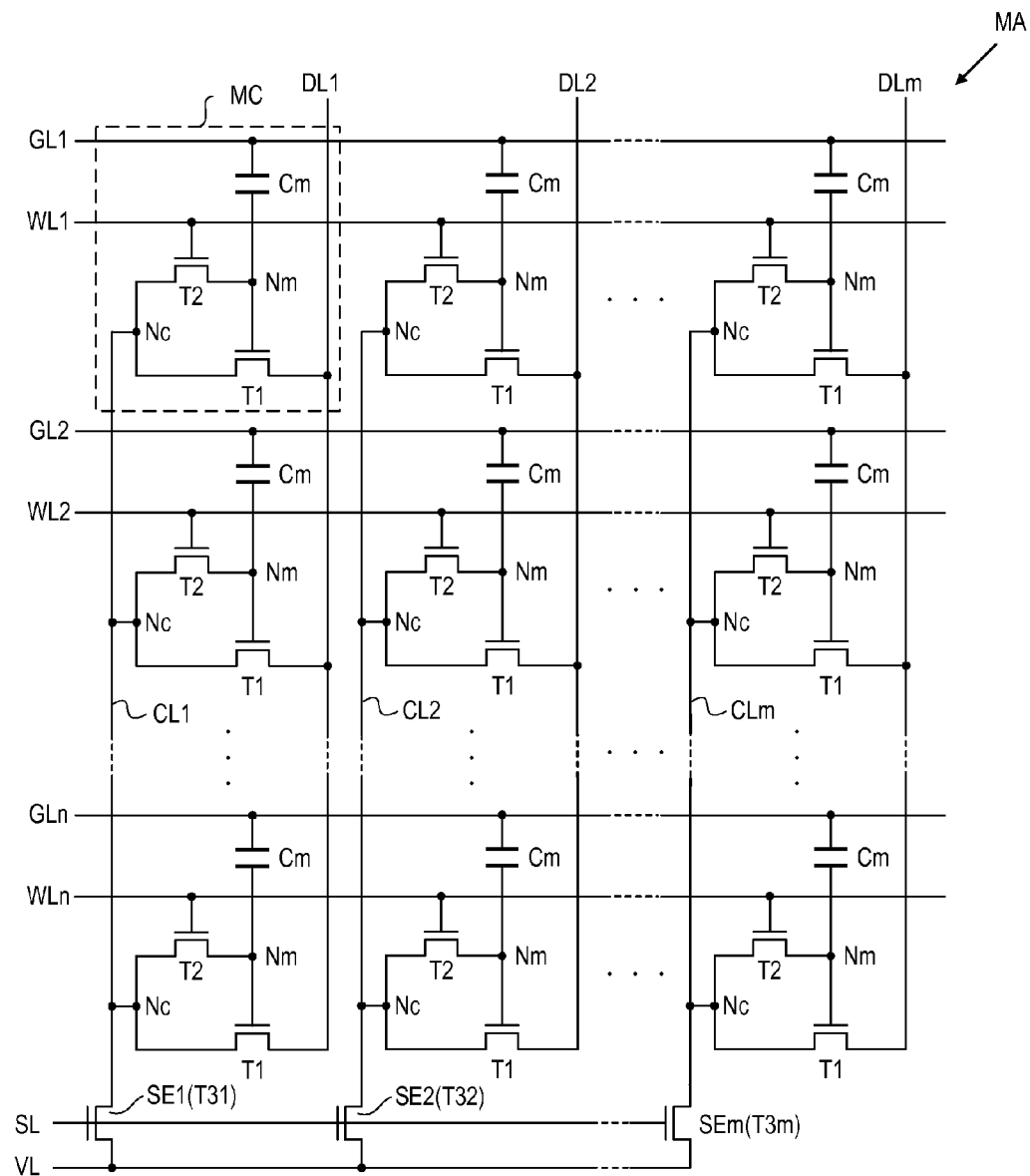
FIG. 3 is an equivalent circuit diagram showing one circuit configuration example of a memory cell array used in the semiconductor memory device in the present invention.

FIG. 3 shows an equivalent circuit diagram of a memory cell array MA in which a plurality of the memory cells MC shown in FIG. 1 are arranged in each of a row direction and a column direction. In FIG. 3, an X direction in the drawing is defined as a row direction, and a Y direction in the drawing is defined as a column direction, for the sake of convenience. The memory cell array MA is provided with m data lines DL (DL1, DL2, . . . , DLm) extending in the column direction, m first control lines CL (CL1, CL2, . . . , CLm) extending in the column direction, n first word lines WL (WL1, WL2, . . . , WLn) extending in the row direction, and n second word lines GL (GL1, GL2, . . . , GLn) extending in the row direction. In addition, m represents an integer of 1 or more, and n represents an integer of 2 or more.

As shown in FIG. 3, switching elements SEj (j=1 to m) are provided in a periphery on one side of the column direction in the memory cell array MA, so as to correspond to the m first control lines CLj (j=1 to m) in the memory cell array MA, respectively. One end of the switching element SEj is connected to the first control line CLj, and the other end thereof is connected to a voltage supply line VL.

According to this embodiment, it is assumed that each switching element SEj serves as a third transistor element T3j which is the n-channel MOSFET formed on the silicon substrate similar to the first transistor element T1, or the n-channel thin film transistor (TFT) similar to the second transistor element T2.

The third transistor element T3j (j=1 to m) has a source electrode connected to the corresponding first control line CLj (j=1 to m), a drain electrode connected to the shared voltage supply line VL, and a gate electrode connected to a shared second control line SL.

Furthermore, in the following description, as for the data line DL, the first control line CL, the first word line WL, the second word line GL, the switching element SE, and the third transistor element T3, the column number j (j=1 to m) or the row number i (i=1 to n) is occasionally omitted.

Figure 4:
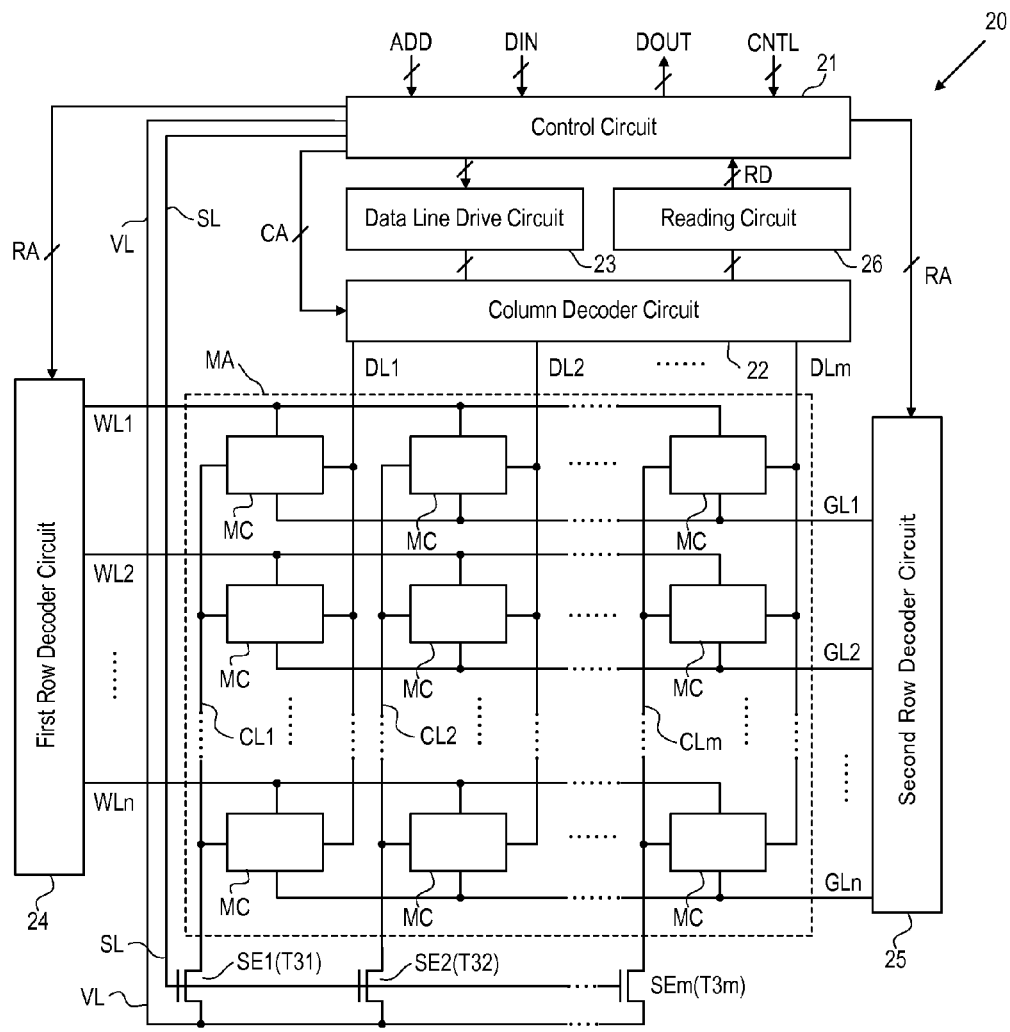
FIG. 4 is a block diagram showing one example of a schematic configuration of the semiconductor memory device in the present invention.

FIG. 4 is a block configuration diagram showing one configuration example of a memory device 20 provided with the memory cell array MA. In this embodiment, the memory device 20 is provided with a control circuit 21, a column decoder circuit 22, a data line drive circuit 23, a first row decoder circuit 24, a second row decoder circuit 25, and a reading circuit 26. The data line drive circuit 23, the first row decoder circuit 24, and the second row decoder circuit 25 correspond to a "data signal line drive circuit", a "first selection line drive circuit", and a "second selection line drive circuit", respectively.

The control circuit 21 communicates with an outside of the memory device 20 to exchange an address signal ADD, a data input signal DIN, a data output signal DOUT, and a control signal CNTL for controlling various memory operations such as initializing, writing, reading which will be described below, and the control circuit 21 generates a column address signal CA for selecting the data line DL to be selected as a target of the writing or reading operation, and supplies the column address signal CA to the column decoder circuit 22. In addition, the control circuit 21 generates a row address signal RA for selecting the first word line WL and the second word line GL to be selected as the target of the writing or reading operation, and supplies the row address signal RA to the first row decoder circuit 24 and the second row decoder circuit 25, and the control circuit 21 gives an instruction to apply a writing voltage VW corresponding to the data input signal DIN to the selected data line DL, converts information RD detected by the reading circuit 26 to the data output signal DOUT, and outputs the converted information RD. Furthermore, the control circuit 21 functions as a switching element control circuit so as to collectively turn on or off the third transistors T3 as the switching elements SE through the second control line SL, and to supply a voltage corresponding to the contents of each memory operation, to the voltage supply line VL.

As described above, the control circuit 21 serves as the comprehensive circuit including an address input buffer, a data I/O circuit, a control signal input buffer, a control circuit for the memory operations, and the like, included in a general semiconductor memory circuit, and since the control circuit 21 can be provided by applying a circuit configuration of a well-known semiconductor memory circuit, and its specific circuit configuration is not a main object of the present invention, its detailed description is omitted.

The column decoder circuit 22 is a circuit for selecting the data line DL to be selected as the target of the writing or reading operation, based on the column address signal CA. In the writing operation, the writing voltage VW corresponding to the input data is applied from the data line drive circuit 23 to the selected data line DL selected by the column decoder circuit 22. In addition, in the reading operation, a reading voltage or a reading current outputted from the source electrode of the first transistor element T1 of the memory cell MC connected to the selected data line DL selected by the column decoder circuit 22 is selectively transferred to the reading circuit 26. Since the above function of the column decoder circuit 22 can be provided by applying a circuit configuration of a well-known column decoder circuit, and its specific circuit configuration is not a main object of the present invention, its detailed description is omitted.

The data line drive circuit 23 applies the writing voltage VW corresponding to the input data to the selected data line DL selected by the column decoder circuit 22, and applies a writing inhibition voltage VIW which will be described below, to the unselected data line DL not selected by the column decoder circuit 22 as the writing target. A correspondence relationship between the input data and the writing voltage VW, and a specific example of the writing inhibition voltage VIW will be described in detail in a description for the writing operation below. In addition, since the data line drive circuit 23 can be provided by applying a well-known signal line drive circuit or the like, and its specific circuit configuration is not a main object of the present invention, its detailed description is omitted.

The first row decoder circuit 24 is a circuit for selecting the first word line WL to be selected as the target of the writing operation or initialization operation, based on the row address signal RA. More specifically, the first row decoder circuit 24 applies a first selection voltage VSL1 to the first word line WL connected to the memory cell MC selected as the initialization or writing target to turn on the second transistor element T2 of the memory cell MC in the selected row, while the first row decoder circuit 24 applies a first non-selection voltage VUS1 to the first word line WL connected to the memory cell MC in the unselected row not selected as the initialization or the writing target to turn off the second transistor element T2 in the memory cell MC in the unselected row. In addition, the initialization operation can be executed with respect to each row, or can be collectively executed with respect to the plurality of the rows. In the case where the initialization operation is collectively executed for the plurality of the rows (all of the rows, for example), the plurality of the rows are selected. Furthermore, the first row decoder circuit 24, in the reading operation, applies the first non-selection voltage VUS1 to the first word lines WL in all of the rows to turn off the second transistor elements. The first non-selection voltage VUS1 is not necessarily the same voltage among the memory operations. Thus, as for the memory cell MC in the selected row in the initialization operation and the writing operation, the first control line CL is connected to the memory node Nm. Meanwhile, as for the memory cell MC in the unselected row in the initialization operation and the writing operation, and as for all of the memory cells MC in the reading operation, the first control line CL is not connected to the memory node Nm, so that the memory node Nm is in a floating state. Since the first row decoder circuit 24 can be provided by applying a well-known row decoder circuit, and its specific circuit configuration is not a main object of the present invention, its detailed description is omitted.

The second row decoder circuit 25 is a circuit which selects the second word line GL to be selected as the targets of the memory operations of the initialization operation, the writing operation, and the reading operation, based on the row address signal RA. More specifically, the second row decoder circuit 25 applies a second selection voltage VSL2 to the second word line GL connected to the memory cell MC in the selected row selected as the target of each memory operation to activate the first transistor element T1 in the memory cell MC in the selected row, while the second row decoder circuit 25 applies a second non-selection voltage VUS2 to the second word line GL connected to the memory cell MC in the unselected row not selected as the target of each memory operation to inactivate the first transistor element T1 of the memory cell MC in the unselected row. Since the second row decoder circuit 25 can be provided by applying a well-known row decoder circuit, and its specific circuit configuration is not a main object of the present invention, its detailed description is omitted.

Here, the activated state of the first transistor element T1 means a state in which a current flows between the drain and the source of the first transistor element T1 after the voltage state of the memory node (gate electrode of the first transistor element T1) has been initialized in the initialization operation, and a current amount flowing between the drain and the source of the first transistor element T1 depends on a voltage state of the memory node Nm after the writing operation. The same voltage value is used for the memory cell MC in the selected row as the second selection voltage VSL2 in each memory operation. Meanwhile, the inactivated state of the first transistor element T1 means a state in which the voltage of the second word line GL is shifted from the second selection voltage VSL2 to the second non-selection voltage VUS2 and the voltage state of the memory node Nm is changed due to capacitive coupling through the capacitive element Cm, so that the first transistor element T1 is forcibly turned off and a current does not flow between the drain and the source regardless of the voltage state of the memory node Nm in activated state after the initialization operation or the writing operation. The same voltage value is used for the memory cell MC in the selected row as the second non-selection voltage VUS2 in each memory operation.

When a voltage shift of the second word line GL, that is, a voltage difference between the second selection voltage VSL2 and the second non-selection voltage VUS2 is $\Delta V2$ (=VSL2−VUS2), a voltage change of the memory node Nm because of the shift of the voltage of the second word line GL from the second selection voltage VSL2 to the second non-selection voltage VUS2 is equal to a voltage $\Delta Vm$ (=$\Delta V2 \times R$) which is provided by multiplying the voltage shift $\Delta V2$ of the second word line GL by a capacity ratio R (=Cm/CNm) of total capacity Cm between both ends of the capacitive element to total capacity CNm parasitic to the memory node Nm. Therefore, since a maximum value of the voltage of the memory node Nm in the activated state after the initialization operation or the writing operation is VME, a maximum value of the voltage of the memory node Nm in the inactivated state is equal to a voltage value VME−$\Delta V2 \times R$. Thus, the voltage shift $\Delta V2$ of the second word line GL and the capacity ratio R are previously set so that a difference between the above voltage value and a minimum voltage applied to the data line DL becomes smaller than a minimum value (0.8 V in the following example) of a threshold voltage Vt1 of the first transistor element T1 determined with taking a variation of the threshold voltage Vt1 into consideration.

The reading circuit 26, in the reading operation, selectively detects the reading voltage or the reading current outputted to the selected data line DL in the selected column selected by the column decoder circuit 22, among the reading voltages or the reading currents outputted to the data line DL from the memory cell in the selected row selected by the second row decoder circuit 25, and reads the information stored in the selected memory cell positioned in the selected row and the selected column. The reading circuit 26 is composed of a voltage detection type sense amplifier when detecting the reading voltage, while the reading circuit 26 is composed of a current detection type sense amplifier when detecting the reading current. Since a specific circuit configuration of the reading circuit 26 can be provided by applying a circuit configuration of a well-known sense amplifier, as the voltage detection type and the current detection type sense amplifiers, and the specific circuit configuration of the reading circuit 26 is not a main object of the present invention, its detailed description is omitted.

Second Embodiment

In the second embodiment, a detailed description will be given to the initialization operation, the writing operation, and the reading operation, for the memory cell array MA, in accordance with the circuit configuration of the memory cell MC, the memory cell array MA, and the memory device 20 described in the first embodiment. In the following description, it is assumed that a plurality of bits of the input data inputted as the data input signal DIN are divided to every two bits, and one of four-value data (0 to 3) each having the two bits is written in the one memory cell MC, and one of the four-value data written in each memory cell MC is read. In addition, according to this embodiment, the voltage state of the memory node Nm which has been initialized in the initialization operation is allocated to the one data value "3" in the four-value data, but the initialized voltage state is not necessarily allocated to the one data value.

In addition, in the following description, it is assumed that typical values of the threshold voltages of the first to third transistor elements T1 to T3 are 1.0 V, and its variation falls within ±0.2 V, as one example. In addition, the typical values of the threshold voltages of the first to third transistor elements T1 to T3 are not necessarily the same.

<Initialization Operation and Writing Operation>

The initialization operation is performed such that an initialization voltage VME is written in the memory node Nm, in which the initialization voltage VME is equal to or higher than a memory voltage VM3 which corresponds to the data value "3" and is highest in four memory voltages VM0 to VM3 which correspond to the data values "0" to "3" and are stored in the memory node Nm of the memory cell MC. In the initialization operation in this embodiment, since the memory voltage VM3 is used as the initialization voltage VME, a memory state of the memory cell is initialized to the data value "3". As for the memory cells MC storing the data values "0" to "2", the initialization operation is an operation to raise (charge) the voltage state of the memory node Nm of the memory cell MC from one of the voltage states of the memory voltages VM0 to VM2 to the initialization voltage VME. In addition, as for the memory cell MC storing the data value "3", the initialization operation is an operation to correct a fluctuation of the voltage state of the memory node Nm of the memory cell MC and reset the voltage state to the original initialization voltage VME. In the following description, it is assumed that a relationship among the memory voltages VM0 to VM2 and the initialization voltage VME satisfies a relationship shown in the following formula 1.

VM0<VM1<VM2<VM3=VME       (Formula 1)

The initialization operation is executed by the row. The following description is given to a case where the initialization operation is executed for the memory cells MC in the one selected row, but the operation can be similarly performed even in a case where the memory cells MC in the plurality of the rows are initialized together, by selecting the plurality of the rows.

The writing operation is performed such that any one of the three memory voltages VM0 to VM2 corresponding to the data values "0" to "2" is written in the memory node Nm of the initialized memory cell MC. More specifically, the writing operation is an operation to lower (discharge) the voltage state of the memory node Nm of the memory cell MC from the initialization voltage VME to any one of the voltage states of the memory voltages VM0 to VM2.

The writing operation is performed by the memory cell. However, the respective writing operations for the memory cells MC in the same row can be executed at the same time. In this case, the writing operation can be collectively performed for the memory cells MC in the selected one row belonging to all of the columns, or the writing operation can be selectively performed for the memory cells MC belonging to the one or more selected columns.

Figure 5:
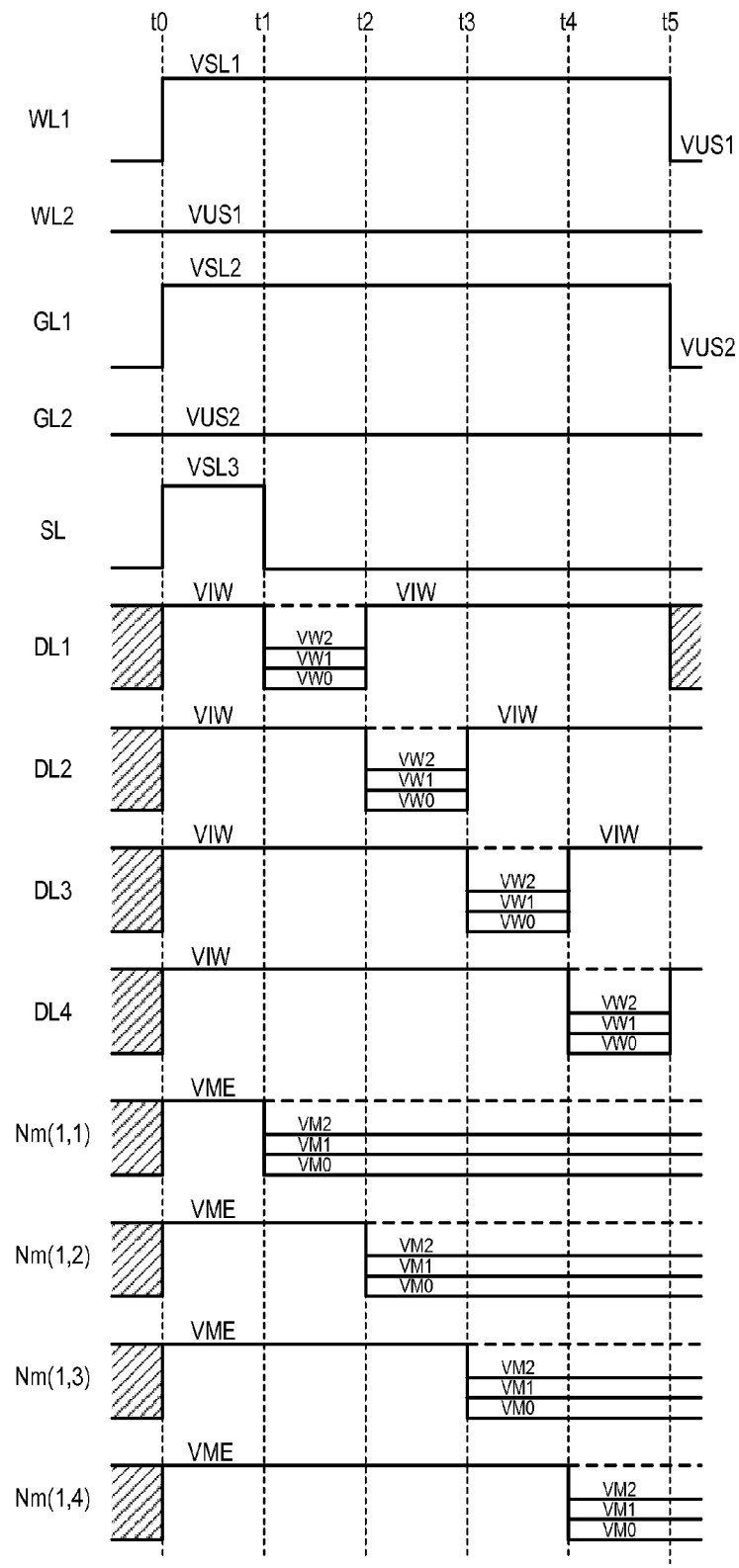
FIG. 5 is a timing chart showing one example of an operation procedure of an initialization operation and a writing operation.

FIG. 5 shows a timing chart in a case where the initialization operation is performed for the one selected row, and the writing operation is performed by sequentially selecting the data lines DL. As one example, in the writing operation, it is assumed that the memory cells MC(1) to MC(m) in all of the columns in the initialized row are divided into four groups, and the writing operation is collectively performed for the memory cells MC in each group. The number of the columns in each group is set to k (=m14). Hereinafter, for convenience of the description, it is assumed that the first group is a group having the column number of 4j+1 (j=0 to k−1), the second group is a group having the column number of 4j+2 (j=0 to k−1), the third group is a group having the column number of 4j+3 (j=0 to k−1), and the fourth group is a group having the column number of 4j+4 (j=0 to k−1). In addition, it is assumed that the first row is the selected row, and the second row to the n-th row are unselected rows.

FIG. 5 shows the respective voltage levels of the first word line WL1 in the selected row (first row), the first word line WL2 in the unselected row (second row), the second word line GL1 in the selected row (first row), the second word line GL2 in the unselected row (second row), the data line DL1 in the first column representing the first group, the data line DL2 in the second column representing the second group, the data line DL3 in the third column representing the third group, the data line DL4 in the fourth column representing the fourth group, the memory node Nm (1, 1) of the memory cell MC in the first column representing the first group, the memory node Nm (1, 2) of the memory cell MC in the second column representing the second group, the memory node Nm (1, 3) of the memory cell MC in the third column representing the third group, the memory node Nm (1, 4) of the memory cell MC in the fourth column representing the fourth group, and the second control line SL.

The initialization operation is performed for all of the memory cells MC in the first row during a period of times t0 to t1, the writing operation is performed for all of the memory cells MC in the first group during a period of times t1 to t2, the writing operation is performed for all of the memory cells MC in the second group during a period of times t2 to t3, the writing operation is performed for all of the memory cells MC in the third group during a period of times t3 to t4, and the writing operation is performed for all of the memory cells MC in the fourth group during a period of times t4 to t5.

Although not shown, the initialization voltage VME is applied to the voltage supply line VL in the initialization operation and the writing operation (times t0 to t5), but the initialization voltage VME is not necessarily required to be applied to the voltage supply line VL in the writing operation (times t1 to t5) because the third transistor element T3*j* is in the off state for the meantime. However, in a case where the initialization operation and the writing operation are performed repeatedly while the selected row is sequentially switched, the control voltage VME is applied to the voltage supply line VL again when the initialization operation is subsequently performed for the next row after the writing operation has been performed for the one row, so that it is preferable that the voltage state is also the same in the writing operation.

Figure 6A:
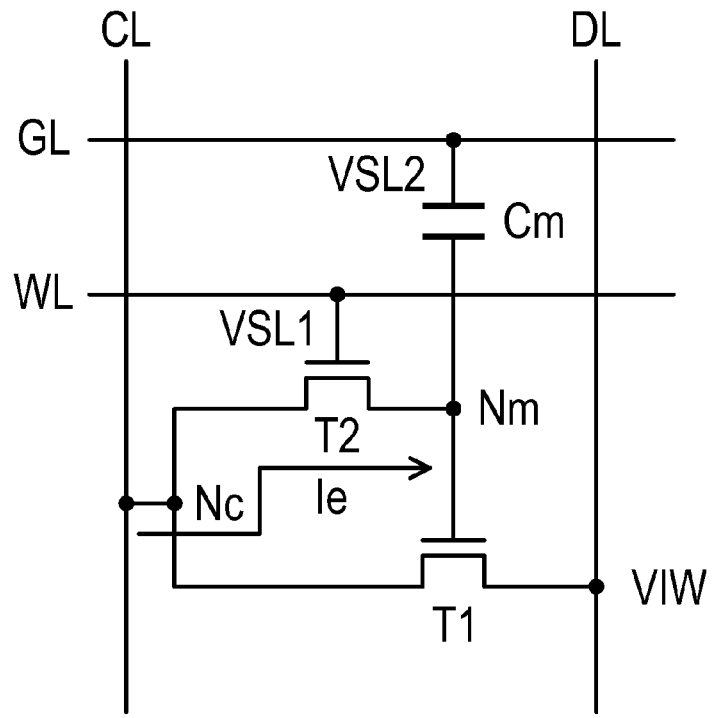
FIGS. 6A and 6B are circuit diagrams showing states of transistor elements in memory cells in a selected row and an unselected row in the initialization operation.
Figure 6B:
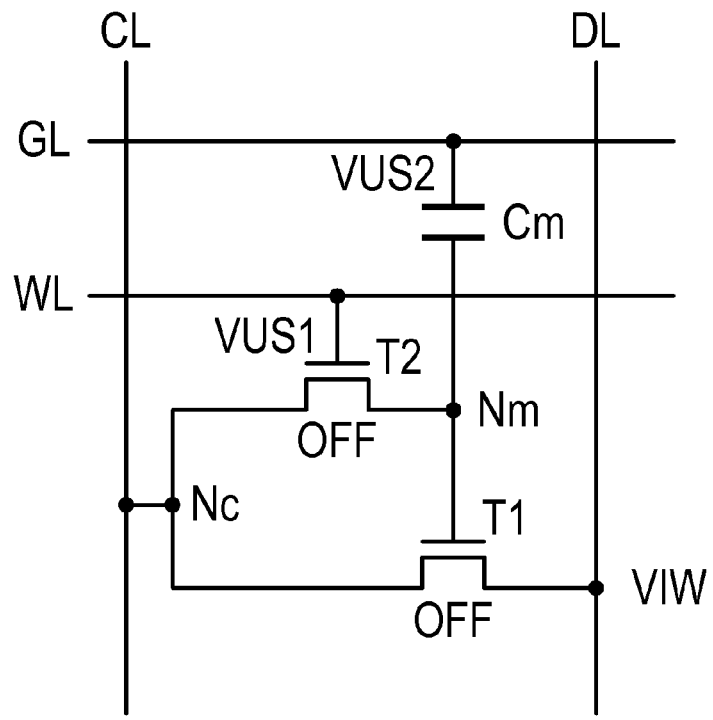
Figure 7A:
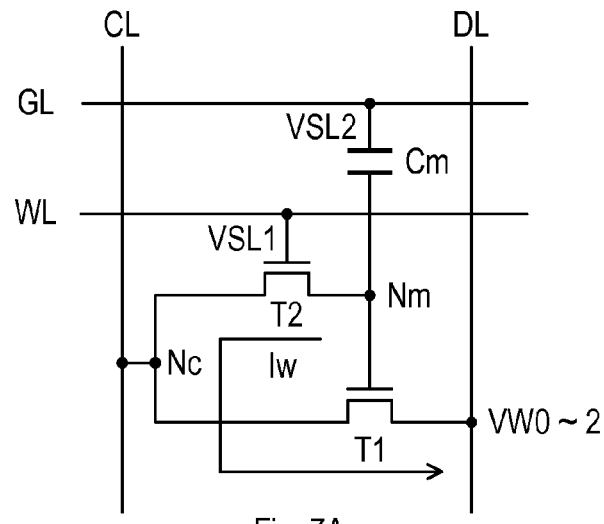
FIGS. 7A to 7C are circuit diagrams showing states of the transistor elements in the memory cells in the selected row and the unselected row in the writing operation.
Figure 7B:
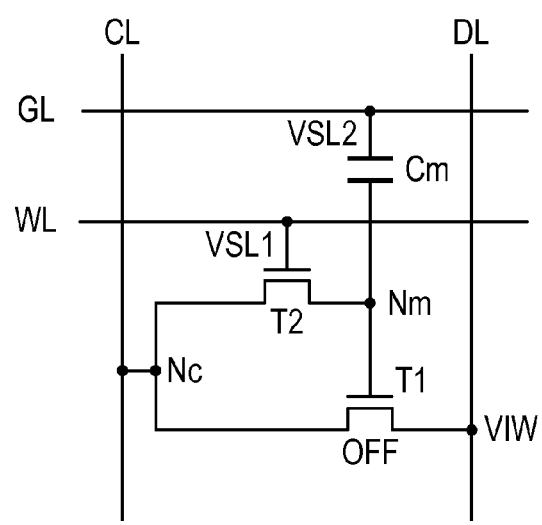
Figure 7C:
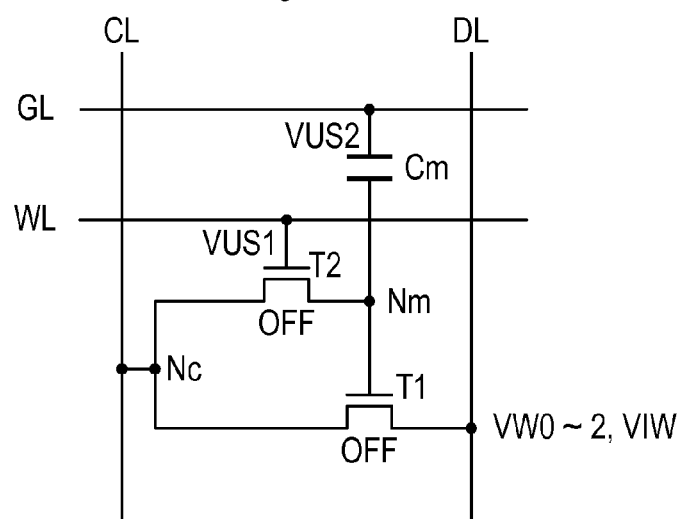

Hereinafter, a detailed description will be given to the initialization operation and the writing operation, with reference to FIGS. 5 to 7C. FIG. 6A shows a state of the transistor element and an initialization current Ie in the memory cell MC in the selected row in the initialization operation, FIG. 6B shows a state of the transistor element in the memory cell MC in the unselected row in the initialization operation, FIG. 7A shows a state of the transistor element and a writing current Iw in the selected memory cell MC, in the writing operation, FIG. 7B shows a state of the transistor element in the memory cell MC in the selected row belonging to the unselected group in the writing operation, and FIG. 7C shows a state of the transistor element in the memory cell MC in the unselected row in the writing operation. In addition, "OFF" shown under the transistor element in FIGS. 6B, 7B, and 7C means that the transistor element is in the off state.

<Initialization Operation>

At the start of the initialization operation (t0), a third selection voltage VSL3 is applied to the second control line SL, so that the third transistor element T3j is turned on, and the first control line CLj in each column is charged to the initialization voltage VME from the voltage supply line VL through the third transistor element T3j.

Furthermore, at the start of the initialization operation (time to), the first selection voltage VSL1 is applied to the first word line WL1 in the selected row (first row), and the second selection voltage VSL2 is applied to the second word line GL1 in the selected row (first row), so that the second transistor elements T2 in all of the memory cells MC in the selected row (first row) are turned on. Each voltage level of the first selection voltage VSL1 and the third selection voltage VSL3 is set so as to be higher than a voltage value Va (=VME+Vtmax) provided by adding a maximum value Vtmax (=1.2 V) in fluctuation ranges of threshold voltages Vt2 and Vt3 of the second transistor element T2 and the third transistor element T3, to the initialization voltage VME. Thus, the voltage level of the memory nodes Nm in all of the memory cells MC is initialized to the initialization voltage VME through the on-state second transistor elements T2 and third transistor elements T3.

The second selection voltage VSL2 has the same voltage value in each memory operation as described above, and it is set to be higher than the second non-selection voltage VUS2 which also has the same voltage value in each memory operation. Since the second word line GL is used to forcibly turn off the first transistor element T1 of the memory cell MC in the unselected row, the voltage difference ΔV2 (=VSL2−VUS2) between the second selection voltage VSL2 and the second non-selection voltage VUS2 is set so that when the voltage level of the second word line GL is shifted from the second selection voltage VSL2 to the second non-selection voltage VUS2, the voltage level of the memory node Nm is reduced from one of the voltage states (VM0, VM1, VM2, VME) after the writing operation to a voltage value lower than a minimum value Vt1min (=0.8 V) in a fluctuation range of the threshold voltage Vt1 of the first transistor element T1, which is 0 V or less, for example, through the capacitive element Cm.

In addition, when the voltage of the data line DL in each column is lower than a voltage value Vb (=VME−Vt1min) provided by subtracting the minimum value Vt1min (=0.8 V) in the fluctuation range of the threshold voltage Vt1 of the first transistor element T1 from the initialization voltage VME, there is a possibility that the first transistor element T1 is turned on, and accumulated charges in the memory node Nm is extracted to the data line DL through the first transistor element T1 and the second transistor element T2, and as a result the initialization operation could not be correctly performed. Therefore, the voltage state of the data line DL in each column is set at the writing inhibition voltage VIW (corresponding to an initialization auxiliary voltage) which is higher than the voltage value Vb during the period of the initialization operation. As one example, the writing inhibition voltage VIW is set to be equal to or higher than the initialization voltage VME.

As for the memory cell MC having the one of the data values "0" to "2" in the memory node Nm before the initialization, the voltage of the memory node Nm is lower than the initialization voltage VME, so that the initialization current Ie flows through the second transistor element T2 and the third transistor element T3, and the memory node Nm is charged to the initialization voltage VME. In addition, as for the memory cell MC having the data value "3" in the memory node Nm before the initialization, the memory node Nm keeps the state initialized to the initialization voltage VME in the previous initialization operation, so that in a case where the voltage is fluctuated due to a leak current or the like, it is reset to the initialization voltage VME through the second transistor element T2 and the third transistor element T3.

In the initialization operation (times t0 to t1), the first non-selection voltage VUS1 is applied to the first word lines WL2 to WLn in the unselected rows (second to n-th rows), and the second non-selection voltage VUS2 is applied to the second word lines GL2 to GLn in the unselected rows (second to n-th rows), so that the first transistor elements T1 and the second transistor elements T2 in all of the memory cells MC in the unselected rows (second to n-th rows) are turned off. When the second transistor element T2 is turned off, the memory node Nm of each memory cell MC in the unselected row becomes the floating state, and the initialization operation is not performed and the voltage state before the initialization operation is maintained. In addition, the voltage level of the first non-selection voltage VUS1 only has to be set lower than a voltage provided by adding a minimum value Vtmin (=0.8 V) in a fluctuation range of the threshold voltage Vt2 of the second transistor element T2 to a lower limit value of voltage ranges that the memory node Nm and the control node Nc can take.

According to this embodiment, in the initialization operation (times t0 to t1), the writing inhibition voltage VIW is applied to the data line DL in each column as described above, so that even when the second selection voltage VSL2 is applied to the second word lines GL2 to GLn in the unselected rows (second to n-th rows) similar to the second word line GL1 in the selected row (first row), the first transistor element T1 is in the off state. Thus, in the initialization operation (times t0 to t1), the second selection voltage VSL2 may be applied to the second word lines GL2 to GLn in the unselected rows (second to n-th rows). However, as will be described below, in the writing operation, the second non-selection voltage VUS2 needs to be applied to the second word lines GL2 to GLn in the unselected rows (second to n-th rows) to turn off the first transistor elements T1 of the memory cells MC in the unselected rows (second to n-th rows), so that as shown in FIG. 5, in a case where the writing operation is performed subsequently after the initialization operation, the second non-selection voltage VUS2 is preferably applied to the second word lines GL2 to GLn in the unselected rows (second to n-th rows) also in the initialization operation (times t0 to t1).

When the signal level applied to the second control line SL is shifted from the third selection voltage VSL3 to a third non-selection voltage VUS3 at the time t1, the third transistor element T3j is turned off, and the first control line CLj in each column becomes the floating state. Thus, the initialization operation is finished. In a case where after the initialization operation, the writing operation is subsequently performed for the selected row (first row) which has been the initialization operation target, the first selection voltage VSL1 is continuously applied to the first word line WL1 in the selected row (first row). In a case where after the initialization operation, the initialization operation is performed for another row, a case where the writing operation is performed for the other row which has been initialized, a case where the reading operation is performed for the one row, or a case where the data stored in each memory cell MC is held without performing any memory operation, the signal level applied to the first word line WL1 in the selected row (first row) is shifted from the first selection voltage VSL1 to the first non-selection voltage VUS1 at the time t1. According to the timing chart illustrated in FIG. 5, the writing operation is subsequently performed in the same selected row (first row), so that the first selection voltage VSL1 is continuously applied to the first word line WL1, and the second selection voltage VSL2 is continuously applied to the second word line GL1.

<Writing Operation>

According to the timing chart illustrated in FIG. 5, the writing operations for the memory cells MC belonging to the four groups are executed sequentially during the four sequential writing operation periods of the times t1 to t2, the times t2 to t3, the times t3 to t4, and the times t4 to t5, respectively. The writing operation for the memory cells MC belonging to the same group is collectively executed at the same time in the one writing operation period. However, the writing voltage VW corresponding to data to be written is individually applied to each memory cell MC in the one group selected as the writing target through the data line DL by the memory cell.

According to the timing chart illustrated in FIG. 5, the writing operations are continuously performed following the initialization operation for the same selected row (first row) which has been the initialization operation target, so that the first selection voltage VSL1 is continuously applied to the first word line WL1 and the second selection voltage VSL2 is continuously applied to the second word line GL1 during the four writing operation periods of the time t1 to the time t5. The first non-selection voltage VUS1 is applied to the first word lines WL2 to WLn in the unselected rows (second to n-th rows), similarly to the time of the initialization operation (times t0 to t1), and the second non-selection voltage VUS2 is applied to the second word lines GL2 to GLn in the unselected rows (second to n-th rows), similarly to the time of the initialization operation (times t0 to t1). Thus, the first transistor elements T1 and the second transistor elements T2 in the memory cells MC in the selected row (first row) belonging to all of the groups are turned on, and the first transistor elements T1 and the second transistor elements T2 in the memory cells MC in the unselected rows belonging to all of the groups are turned off, throughout the four writing operation periods. In addition, at the time t1, the signal level applied to the second control line SL is shifted from the third selection voltage VSL3 to the third non-selection voltage VUS3, so that the third transistor elements T3j in the columns are all turned off.

According to this embodiment, as illustrated in FIG. 5, in the case where the memory cells MC are divided into the four groups to perform the writing operations sequentially, when the data to be written is one of "0" to "2", one of the writing voltages VW0 to VW2 corresponding to that data is applied from the data line drive circuit 23 to each data line DL of the memory cell MC belonging to the selected group selected as the writing target. When the data to be written is "3", the writing inhibition voltage VIW (initialization voltage VME or higher) is applied (shown by a broken line in FIG. 5) to the data line DL because the data has been written in the initialization operation. In addition, the writing inhibition voltage VIW (initialization voltage VME or higher) is applied to each data line DL of the memory cells MC belonging to the unselected group not selected as the writing target.

As described above, the writing operation is the operation to lower (discharge) the voltage state of the memory node Nm of the memory cell MC in the selected group from the initialization voltage VME to one voltage state among the memory voltages VM0 to VM2. Here, the writing voltages VW0 to VW2 are set to be lower than the memory voltages VM0 to VM2 by the threshold voltage Vt1 of the first transistor element T1, respectively. At the time of starting the writing operation, since the second transistor element T2 is in the on state, the gate electrode (memory node Nm) and the drain electrode (control node Nc) of the first transistor element T1 are both at the initialization voltage VME, and the source electrode thereof is at one of the writing voltages VW0 to VW2 which are lower than the voltage lower than the initialization voltage VME by the threshold voltage Vt1 of the first transistor element T1. Thus, the first transistor element T1 is turned on, and the writing current Iw flows from the memory node Nm to the data line DL through the second transistor element T2 and the first transistor element T1. As a result, the voltages of the memory node Nm and the control node Nc gradually decrease, and when each of them reaches the voltage level (one of the memory voltages VM0 to VM2) which is higher than each of the writing voltages VW0 to VW2 by the actual threshold voltage Vt1 of the first transistor element T1 of the memory cell MC which is being subjected to the writing operation, the first transistor element T1 is cut off, and the discharge is stopped, so that the writing operation is finished automatically.

A relationship between the writing voltages VW0 to VW2 and the writing inhibition voltage VIW is set to satisfy a relationship shown in the following formula 2 so that the relationship between the memory voltages VM0 to VM2 and the initialization voltage VME satisfies the relationship shown in the formula 1.

$$VW0 < VW1 < VW2 < VIW \quad \text{(Formula 2)}$$

Here, in the above writing operation, it is to be noted that in case where the threshold voltage Vt1 fluctuates with respect to the typical value 1.0 V within a variation range (±0.2 V), the one of the memory voltages VM0 to VM2 actually held in the memory node Nm is higher than one of the writing voltages VW0 to VW2 by the voltage which is provided by adding an actual variation amount to the threshold voltage Vt1. As will be described in detail in the reading operation below, a fluctuation amount of the threshold voltage Vt1 is compensated in the memory voltages VM0 to VM2 actually held in the memory node Nm, so that an operation margin at the time of the reading operation can be considerably improved.

In the case where the data to be written in the memory cell MC belonging to the selected group is "3", the writing inhibition voltage VIW (initialization voltage VME or higher) is applied to the data line DL, and the source voltage of the first transistor element T1 is equal to or higher than the initialization voltage VME held in the memory node Nm, so that the first transistor element T1 is turned off, and a current does not flow between the memory node Nm and the data line DL in any direction. Therefore, the initialization voltage VME as the voltage state after the initialization operation is maintained in the memory node Nm (shown by a broken line in FIG. 5).

Meanwhile, since the control nodes Nc of the memory cells MC in the rows belonging to the same column are connected to each other through the first control line CL, as for the memory cell MC in the unselected row belonging to the same column as the memory cell MC in the selected group, the voltage of the control node Nc is one of the memory voltages VM0 to VM2 which is the same voltage state as that of the memory node Nm of the memory cell MC in the selected row, but since the second transistor element T2 of the memory cell MC in the unselected row is in the off state, the writing operation is not performed, and the memory node Nm maintains its voltage state at one of the memory voltages VM0 to VM2 or the initialization voltage VME which is held at that moment.

Furthermore, as for the memory cell MC in the unselected row belonging to the same column as the memory cell MC in the selected group, the first transistor element T1 is in the inactivated state and in the off state, but if the first transistor element T1 of the memory cell MC in the unselected row is in the activated state, the first transistor element T1 is turned on, depending on a relationship between the voltage state (one of the memory voltages VM0 to VME) of the memory node Nm of that memory cell MC, and one of the writing voltages VW0 to VW2 applied to the data line DLj, so that the first control line Clj is connected to the data line DLj through the first transistor element T1 of the memory cell MC in the unselected row, and there is a possibility that the voltage of the control node Nc is reduced to one of the writing voltages VW0 to VW2 applied to the data line DLj. Therefore, in order to eliminate that possibility, it is necessary to inactivate the first transistor element T1 to forcibly keep the first transistor element T1 in the off state by applying the second non-selection voltage VUS2 to the second word lines GL2 to GLn in the unselected rows (second to n-th rows) in the writing operation (times t1 to t5).

The writing inhibition voltage VIW (initialization voltage VME or higher) is applied to the data line DL of the memory cell MC in the same selected row (first row) belonging to the unselected group. The initialization voltage VME is held in the memory node Nm of the memory cell MC belonging to the unselected group after the initialization operation and before the writing operation, so that the source voltage of the first transistor element T1 is equal to or higher than the initialization voltage VME which is the gate voltage, and the gate voltage and the drain voltage are the same voltage through the second transistor element T2. Consequently, the first transistor element T1 is turned off, and a current does not flow between the memory node Nm and the data line DL in any direction. Thus, the memory node Nm is maintained at the initialization voltage VME which is the voltage state initialized in the initialization operation. Meanwhile, as for the memory cell MC belonging to the unselected group in which the writing operation has been performed after the initialization operation, its memory node Nm is maintained at one of the memory voltages VM0 to VM2 which compensate the fluctuation amount of the threshold voltage Vt1 of the first transistor element T1, or the initialization voltage VME, so that even when one of the memory voltages VM0 to VM2 lower than the initialization voltage VME is held, the source voltage of the first transistor element T1 is higher than one of the memory voltages VM0 to VM2 which is the gate voltage, and the gate voltage and the drain voltage are the same voltage through the second transistor element T2. Consequently, the first transistor element T1 is turned off, and a current does not flow between the memory node Nm and the data line DL in any direction. Thus, the memory node Nm is maintained at one of the memory voltages VM0 to VM2 which is the voltage state after the writing operation, or the initialization voltage VME.

In the above description, it has been described that as for the memory voltages VM0 to VM2 held in the memory node Nm, the fluctuation amount of the threshold voltage Vt1 of the first transistor element T1 is compensated, but as for the initialization voltage VME held in the memory node Nm, the fluctuation amount of the threshold voltage Vt1 of the first transistor element T1 is not compensated. However, since the initialization voltage VME can be set higher than the memory voltages VM0 to VM2 corresponding to the four-value data values "0" to "2", it is set after making an allowance for the fluctuation amount of the threshold voltage Vt1, so that there is no influence of the fluctuation of the threshold voltage Vt1.

<Reading Operation>

Next, the reading operation will be described. The reading operation is performed such that the reading circuit 26 reads one of the data values "0" to "3" stored in the memory cell MC from the memory cell MC selected as the reading target. First, the description will be given to a case where the reading circuit 26 is the voltage detection type sense amplifier, with reference to FIGS. 8 and 9A to 9C.

Figure 8:
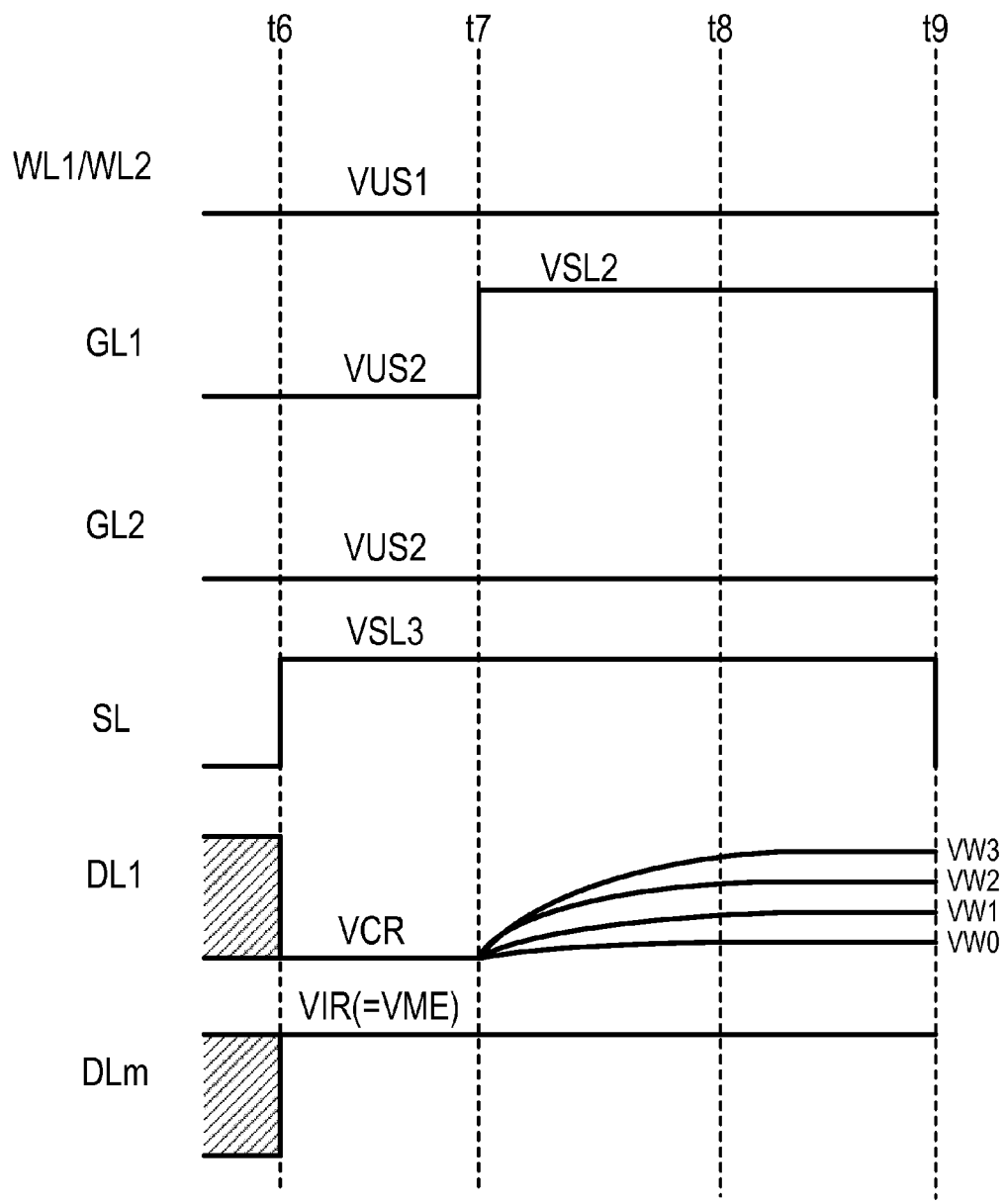
FIG. 8 is a timing chart showing one example of an operation procedure of a reading operation in a case where a reading circuit is a voltage detection type sense amplifier.

FIG. 8 shows a timing chart in a case where the reading operation is performed for the one selected row in which the writing operation has been performed, by selecting one or more data lines DL. As one example, it is assumed that the first row is the selected row, and the second to n-th rows are unselected rows. Furthermore, in the reading operation, it is assumed that one or more columns are selected in the selected row, and the reading operation is performed for the memory cells MC in the selected columns at the same time.

FIG. 8 shows voltage levels of the first word line WL1 in the selected row (first row), the first word line WL2 in the unselected row (second row), the second word line GL1 in the selected row (first row), the second word line GL2 in the unselected row (second row), the data line DL1 in the first column representing the selected column, the data line DLm in the m-th column representing the unselected column, and the second control line SL. In addition, although not shown, a reading power supply voltage VSR is applied to the voltage supply line VL in the reading operation (times t6 to t9).

Figure 9A:
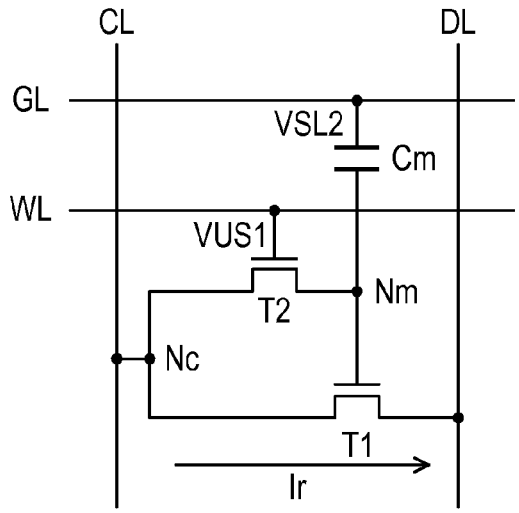
FIGS. 9A to 9C are circuit diagrams showing states of the transistor elements in the memory cells in the selected row and the unselected row in the reading operation.
Figure 9B:
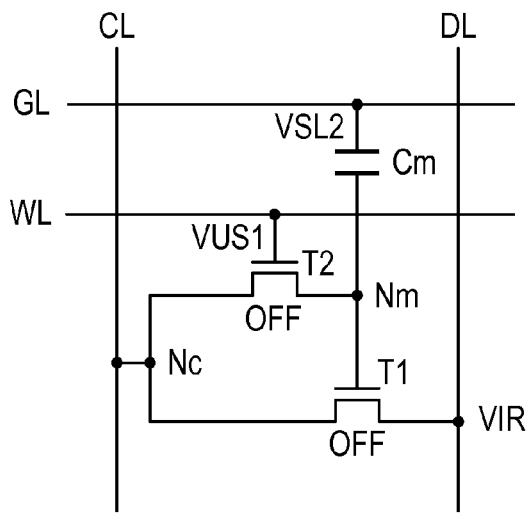
Figure 9C:
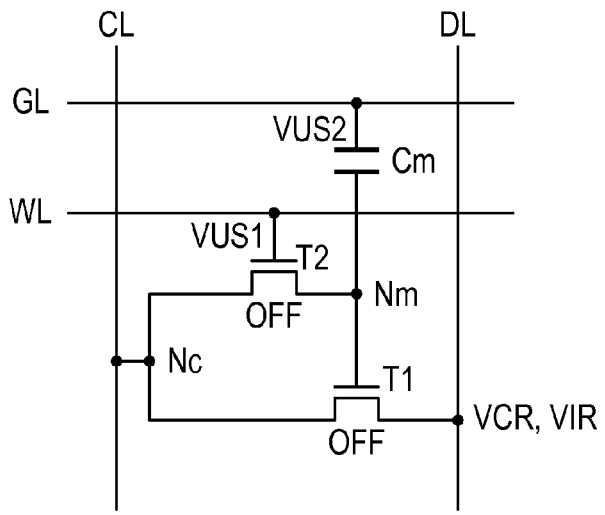

FIG. 9A shows a state of the transistor element and a reading current Ir in the memory cell MC selected in the reading operation, FIG. 9B shows a state of the transistor element of the memory cell MC in the unselected column in the selected row in the reading operation, and FIG. 9C shows a state of the transistor element of the memory cell MC in the unselected row in the reading operation. In addition, "OFF" shown under the transistor element in FIGS. 9B and 9C means that the transistor element is in the off state.

The reading power supply voltage VSR applied to the voltage supply line VL in the reading operation is not necessarily the same voltage as the initialization voltage VME applied in the initialization operation. In the reading operation, the reading power supply voltage VSR needs to be higher than the voltage provided by adding a voltage drop amount in the third transistor element T3 to the above-described voltage value Vb (=VME−Vt1min), in order to operate the first transistor element T1 in a saturation region. When this condition is satisfied, the reading power supply voltage VSR and the initialization voltage VME can be the same voltage. Hereinafter, it is assumed that the reading power supply voltage VSR is equal to or higher than the initialization voltage VME.

During times t6 to t7 in the period of the reading operation, a preliminary drive operation is performed such that at least the first control line CL1 in the selected column (first column) is charged to a voltage level higher than the voltage value Vb (=VME−Vt1min), and the data line DL1 in the selected column (first column) is driven at a reading column voltage VCR equal to or lower than the lowest writing voltage VW0. Therefore, at the time t6, the third selection voltage VSL3 is applied to the second control line SL, and the third transistor element T3j in each column is turned on. According to this embodiment, the first control line CL1 in the unselected column is also charged to the voltage level higher than the voltage value Vb (=VME−Vt1min). The third selection voltage VSL3 in the reading operation may be the same voltage as that in the initialization operation, but the third selection voltage VSL3 may be a different voltage as long as the first control line CL1 can be charged to the voltage level higher than the voltage value Vb (=VME−Vt1min).

In this embodiment, as one example, the reading column voltage VCR is set at the same voltage as the writing voltage VW0. At the time t7, the preliminary driving for the data line DL1 in the selected column (first column) is finished, and then the data line DL1 becomes a floating state. The data line DLm in the unselected column (m-th column) is driven at a reading inhibition column voltage VIR during the period of the reading operation (t6 to t9). The reading inhibition column voltage VIR is set higher than the above-described voltage value Vb (=VME−Vt1min) similar to the reading power supply voltage VSR. According to this embodiment, as one example, it is assumed that the reading inhibition column voltage VIR and the initialization voltage VME are the same voltage.

When the preliminary drive operation for the first control line CL1 and the data line DL1 in the selected column (first column) is finished (at the time t7), the second selection voltage VSL2 is applied to the second word line GL1 in the selected row (first row). The second non-selection voltage VUS2 is applied to the second word lines GL2 to GLn in the unselected rows (second to n-th rows), and the first non-selection voltage VUS1 is applied to all of the first word lines WL1 to WLn in the selected row (first row) and the unselected rows (second to n-th rows) during the period of the reading operation (t6 to t9). Thus, during the period of the reading operation (times t6 to t9), the second transistor elements T2 of all of the memory cells MC are turned off, and the first transistor elements T1 of the memory cells MC in the unselected rows (second to n-th rows) are inactivated and turned off regardless of the memory state of the memory cell MC and the voltage level of the data line DL. Meanwhile, the first transistor element T1 of the memory cell MC in the selected row (first row) is activated and turned on based on the memory state of the memory cell MC and the voltage level of the data line DL during the times t7 to t9.

As described above, the control nodes Nc of the memory cells MC in the respective rows in the same column are connected to each other through the first control line CL, so that when the first transistor elements T1 of the memory cells MC in the unselected rows (second to n-th rows) are not in the inactivated state, a current path is formed from the shared first control line CL to the data line DL in the selected column through the first transistor element T1 of the memory cell MC in the unselected row, which hinders the correct reading operation for the memory cell MC in the selected row (first row). Therefore, the first transistor elements T1 of the memory cells MC in the unselected rows (second to n-th rows) need to be inactivated.

At the time t7, the source voltage of the first transistor element T1 of the selected memory cell MC has been charged to the reading column voltage VCR (=VW0). Meanwhile, the gate voltage is one of the memory voltages VM0 to VM2, or VME (=VM3) corresponding to one of the memory data "0" to "3". Therefore, drain currents IDS1 (0 to 3) of the first transistor element T1 corresponding to the memory data at the time t7 in the operation in the saturation region are represented by the following formula 3 to formula 6, respectively. In addition, a coefficient β in the formula 3 to formula 6 represents a transconductance of the first transistor element T1. The drain currents IDS1 (0 to 3) are shown as the reading current Ir in FIG. 9A.

$$IDS1\,(0) = \beta \times (VM0 - VCR - Vt1)^2 / 2 \qquad \text{(Formula 3)}$$
$$= \beta \times (VW0 - VCR)^2 / 2$$
$$= 0$$

$$IDS1\,(1) = \beta \times (VM1 - VCR - Vt1)^2 / 2 \qquad \text{(Formula 4)}$$
$$= \beta \times (VW1 - VCR)^2 / 2$$

$$IDS1\,(2) = \beta \times (VM2 - VCR - Vt1)^2 / 2 \qquad \text{(Formula 5)}$$
$$= \beta \times (VW2 - VCR)^2 / 2$$

$$IDS1\,(3) = \beta \times (VME - VCR - Vt1)^2 / 2 \qquad \text{(Formula 6)}$$

From the relationship shown in the formula 1, the drain currents IDS1 (0 to 3) satisfy a relationship shown in the following formula 7.

$$IDS1(3) > IDS1(2) > IDS1(1) > IDS1(0) = 0 \qquad \text{(Formula 7)}$$

After the time t7, when the memory data is "0", the voltage level of the data line DL1 remains at the reading column voltage VCR, and when the memory data is one of "1" to "3", the voltage level of the data line DL1 is charged and raised by one of the drain current IDS1 (1 to 3) corresponding to the memory data. In addition, as the voltage level of the data line DL1 is raised, a voltage difference is reduced between the gate electrode and the source electrode of the first transistor element T1, so that the drain currents IDS1 (1 to 3) is gradually reduced, and the voltage level of the data line DL1 is raised up to the writing voltage VW1 when the memory data is "1", the voltage level of the data line DL1 is raised up to the writing voltage VW2 when the memory data is "2", and the voltage level of the data line DL1 is raised up to a writing voltage VW3 (=VME−Vt1) provided by subtracting the threshold voltage Vt1 from the initialization voltage VME when the memory data is "3". Therefore, after the latest point (time t8) among a point when the voltage level of the data line DL1 exceeds a reference voltage Vref1 intermediate between the writing voltage VW0 and the writing voltage VW1 in the case of the memory data "1", a point when the voltage level of the data line DL1 exceeds a reference voltage Vref2 intermediate between the writing voltage VW1 and the writing voltage VW2 in the case of the memory data "2", and a point when the voltage level of the data line DL1 exceeds a reference voltage Vref3 intermediate between the writing voltage VW2 and the above voltage VW3 in the case of the memory data "3", one of the memory data "0" to "3" corresponding to the voltage level of the data line DL1 can be read when the voltage detection type sense amplifier (reading circuit 26)

detects the inputted voltage level of the data line DL1 selected by the column decoder circuit 22.

Here, it is to be noted that as for the drain currents IDS1 (0 to 2) shown in the formula 3 to formula 5, since each of the gate voltages VM0 to VM2 includes the actual threshold voltage Vt1 of the first transistor element T1 including the variation, the threshold voltage Vt1 is subtracted in a right side of each formula, and the influence of the variation in the threshold voltage Vt1 is compensated. That is, in the case where the memory data is one of "0" to "2", since the voltage level of the data line DL1 at the time t8 is not affected by the variation in the threshold voltage Vt1, the operation voltage margin at the time of the reading operation can be largely provided, so that noise resistance is improved under the same operation voltage, or the multilevel of the memory data can be further enhanced by narrowing an adjacent voltage difference between the writing voltages VW0 to VW2 and the voltage VW3. In addition, as for the drain current IDS1 (3) shown in the formula 6, the threshold voltage Vt1 is not subtracted and remains in the right side of the formula 6, but by setting the initialization voltage VME so as to be sufficiently higher than the memory voltage VM2 beyond the fluctuation range of the threshold voltage Vt1, it can be unaffected by the variation in the threshold voltage Vt1.

At time t9 after the voltage detection type sense amplifier detects the voltage level of the data line DL1 and reads the memory data, the voltage level of the second word line GL1 in the selected row (first row) is shifted from the second selection voltage VSL2 to the second non-selection voltage VUS2, and the first transistor element T1 in the selected row (first row) is turned off regardless of the voltage level of the data line DL, so that the reading operation is finished.

In this embodiment, since the data line DLm in the unselected column is driven at the reading inhibition column voltage VIR, the first transistor element T1 of the memory cell MC in the unselected column is in the off state, and the reading current Ir does not flow during the period of the reading operation (t6 to t9). Furthermore, in this embodiment, the data line DL in the selected column is selected by the column decoder circuit 22, and connected to the voltage detection type sense amplifier (reading circuit 26), while the data line DL in the unselected column is separated from the reading circuit 26 by the column decoder circuit 22, so that the preliminary drive operation may be also performed for the data line DL in the unselected column similar to the data line DL in the selected column, or the preliminary drive operation may not be performed for the data line DL in the unselected column so that the data line DL in the unselected column may be left as it is.

Third Embodiment

Figure 10:
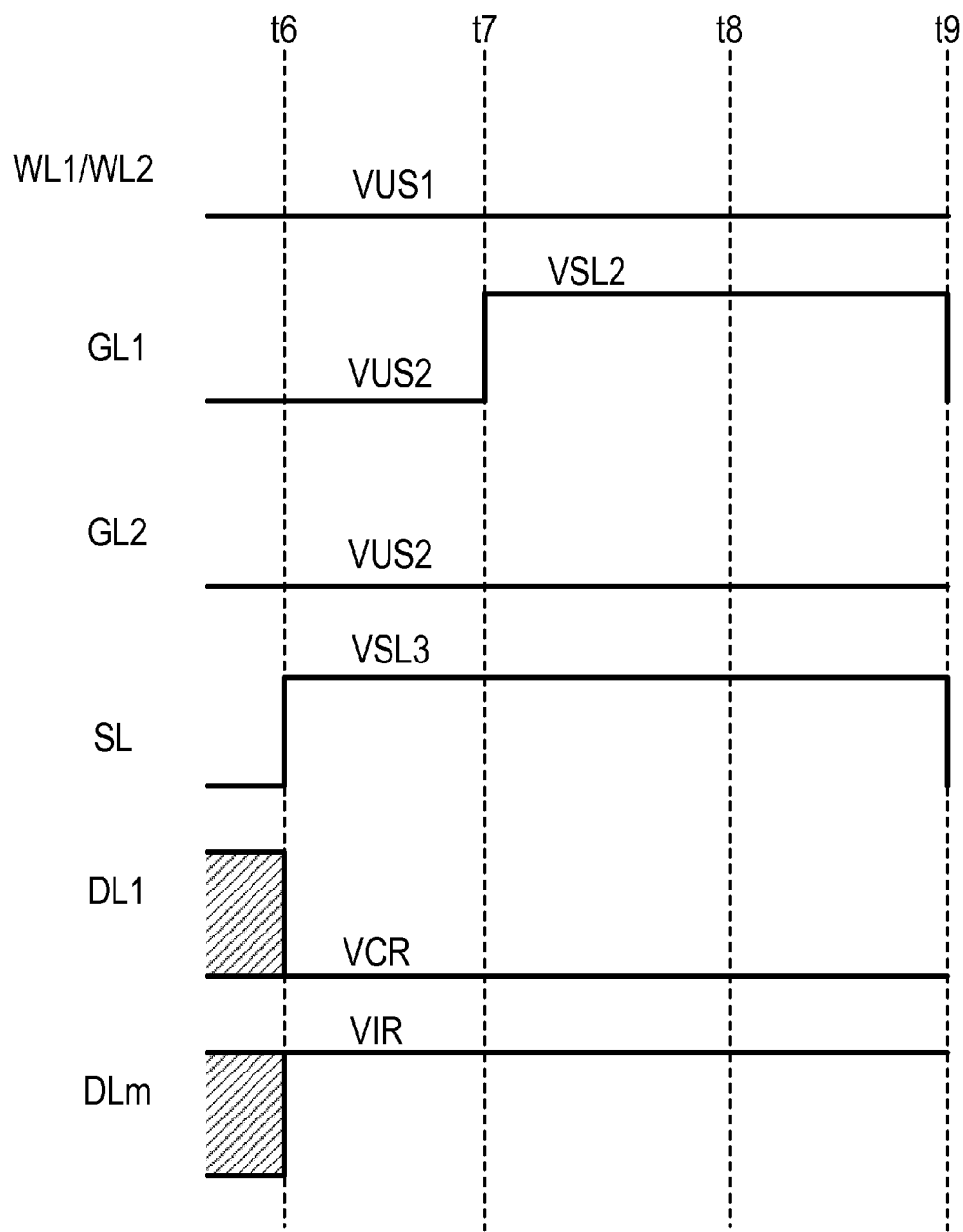
FIG. 10 is a timing chart showing one example of an operation procedure of a reading operation in a case where the reading circuit is a current detection type sense amplifier.

The description has been given to the reading operation in the case where the reading circuit 26 is the voltage detection type sense amplifier in the second embodiment, but in the third embodiment, a description will be given to the reading operation in the case where the reading circuit 26 is the current detection type sense amplifier, with reference to FIGS. 9A to 9C and 10. The initialization operation and the writing operation are the same as descried in the second embodiment. FIG. 10 shows a timing chart in a case where the reading operation is performed for the one selected row after the writing operation has been performed, by selecting one or more data lines DL in the same manner as in FIG. 8. FIGS. 9A to 9C are also applied to the case where the reading circuit 26 is the current detection type sense amplifier.

In the case where the reading circuit 26 is the current detection type sense amplifier, a voltage condition applied to each signal line is the same as that of the voltage detection type sense amplifier except for a voltage drive condition of the data line DL1 in the selected column.

In the case of the current detection type sense amplifier, the data line DL1 in the selected column (first column) is driven at the reading column voltage VCR equal to or lower than the lowest writing voltage VW0 during the period of the reading operation (t6 to t9). Therefore, the voltage level of the data line DL1 is constant regardless of the memory data "0" to "3" during the period of the reading operation (t6 to t9), while the reading current Ir is one of the drain currents IDS1 (0 to 3) shown in the formula 3 to formula 6 in the saturation operation of the first transistor element T1, based on the memory data "0" to "3".

After the time t7, at a point after one of the drain currents IDS1 (1 to 3) has come to flow stably (at the time t8 or later), the current detection type sense amplifier (reading circuit 26) detects the inputted reading current Ir which is outputted from the memory cell MC to the data line DL1 and selected by the column decoder circuit 22, so that the current detection type sense amplifier can read the one of the memory data "0" to "3" corresponding to the current level of the reading current Ir.

Here, it is to be noted that as for the drain currents IDS1 (0 to 2) shown in the formula 3 to formula 5, since each of the gate voltages VM0 to VM2 includes the actual threshold voltage Vt1 of the first transistor element T1 including the variation, the threshold voltage Vt1 is subtracted in the right side of each formula, so that the influence of the variation of the threshold voltage Vt1 is compensated. That is, in the case where the memory data is one of "0" to "2", since a current level of the reading current Ir at the time t8 is not affected by the variation in the threshold voltage Vt1, the operation voltage margin at the time of the reading operation can be largely provided, so that noise resistance is improved under the same operation voltage, or the multilevel of the memory data can be further enhanced by a decrease of an adjacent voltage difference between the writing voltages VW0 to VW2 and the voltage VW3. In addition, as for the drain current IDS1 (3) shown in the formula 6, the threshold voltage Vt1 is not subtracted and remains in the right side of the formula 6, but by setting the initialization voltage VME so as to be sufficiently higher than the memory voltage VM2 beyond the fluctuation range of the threshold voltage Vt1, it can be unaffected by the variation in the threshold voltage Vt1.

At the time t9 after the current detection type sense amplifier detects the current level of the reading current Ir and reads the memory data, the voltage level of the second word line GL1 in the selected row (first row) is shifted from the second selection voltage VSL2 to the second non-selection voltage VUS2, and the first transistor element T1 in the selected row (first row) is turned off regardless of the voltage level of the data line DL. Thus, the reading operation is finished.

According to this embodiment, since the data line DLm in the unselected column is driven at the reading inhibition column voltage VIR, the first transistor element T1 of the memory cell MC in the unselected column is in the off state, and the reading current Ir does not flow during the period of the reading operation (t6 to t9). Furthermore, in this embodiment, the data line DL in the selected column is selected, and connected to the current detection type sense amplifier (reading circuit 26) by the column decoder circuit 22, while the data line DL in the unselected column is separated from the reading circuit 26 by the column decoder circuit 22, so that the data line DL in the unselected row may be driven at the reading column voltage VCR, similarly to the data line DL in the selected column, or may be left as it is without being driven at the reading column voltage VCR.

Fourth Embodiment

In the first to third embodiments, as shown in FIG. 3, it is assumed that the switching element SEj (j=1 to m) provided in the first control line CLj (j=1 to m) is composed of the third transistor element T3*j* of the re-channel MOSFET or the n-channel thin film transistor (TFT) (hereinafter, referred to as a "first type" configuration), and the gate electrodes of the third transistor elements T3*j* are connected to the second control line SL so that their on/off is controlled by the second control line SL. In the fourth embodiment, a description will be given to a configuration example of the switching element SEj which is different from the configuration described in the first embodiment.

Figure 11A:
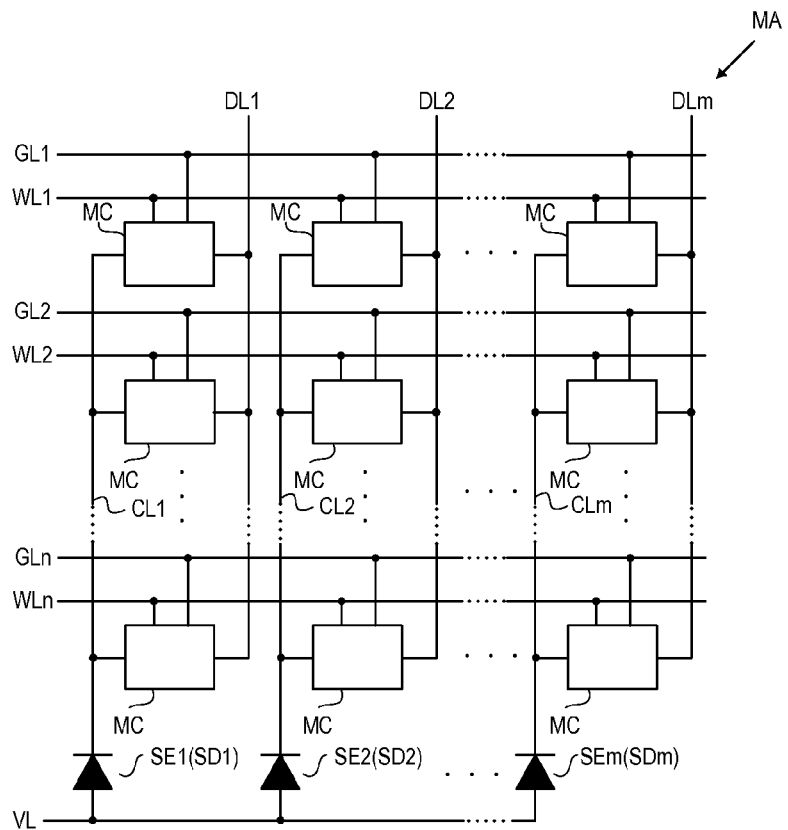
FIGS. 11A and 11B are equivalent circuit diagrams showing other configuration examples of the switching element used in the semiconductor memory device in the present invention.

In the fourth embodiment, instead of the configuration FIG. 3, the switching element SEj is composed of a diode SDj (j=1 to m) having a cathode electrode connected to the first control line CLj, and an anode electrode connected to the voltage supply line VL as shown in FIG. 11A (hereinafter, referred to as a "second type" configuration).

Figure 11B:
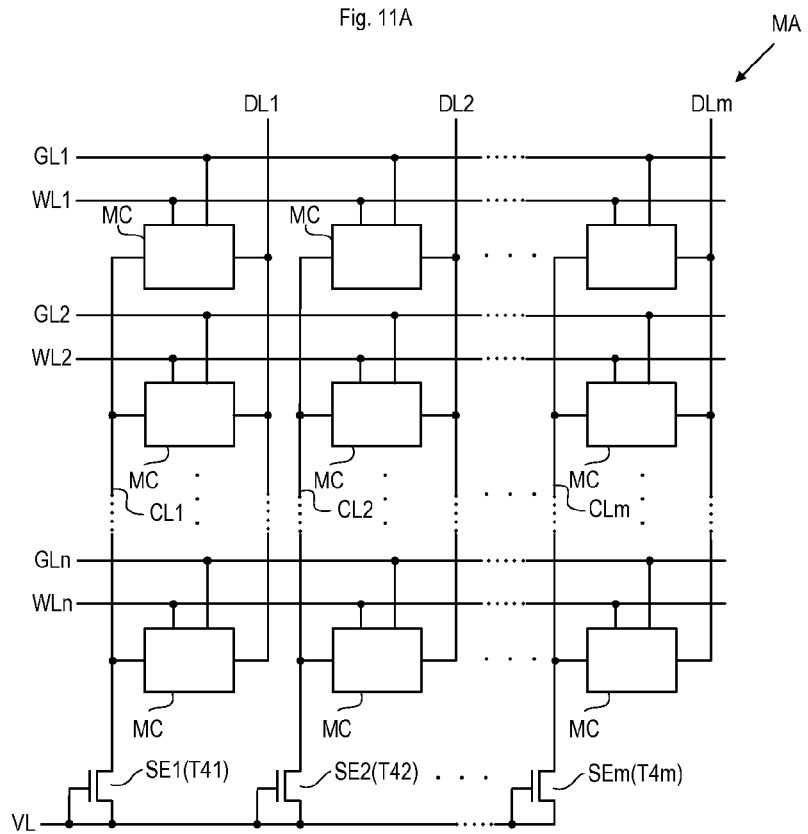

The diode SDj takes various specific shapes such as diode elements including a p-n junction diode using p-n junction of the semiconductor constituting the first transistor element T1, and a pin diode using a pin structure of that semiconductor, and a diode circuit composed of a fourth transistor element T4*j* composed of an insulated gate FET having the same structure and conductivity type as those of the third transistor element T3*j* having the first type configuration, in which a drain electrode and a gate electrode are both connected to the voltage supply line VL, and a source electrode is connected to the first control line CLj as shown in FIG. 11B. The diode SDj can control a conduction/non-conduction between the voltage supply line VL and the first control line CLj, based on the voltage level of the voltage supply line VL. When a voltage difference between the voltage supply line VL and the first control line CLj exceeds a turn-on voltage of the diode SDj, the diode SDj is in the conducting state a current flows from the voltage supply line VL to the first control line CLj. In addition, the turn-on voltage of the diode SDj shown in FIG. 11B is equal to a threshold voltage of the fourth transistor element T4*j*.

Hereinafter, in the fourth embodiment, a complementary description will be given to different points between memory operations in the case where the switching element SEj is composed of the diode SDj having the second type configuration shown in FIGS. 11A and 11B, and the memory operations in the case where the switching element SEj has the first type configuration as described in the second and third embodiments.

First, the on state of the third transistor element T3*j* in the second and third embodiments corresponds to the conducting state of the diode SDj in the fourth embodiment at the time when the voltage difference between the voltage supply line VL and the first control line CLj (control node Nc) exceeds the turn-on voltage of the diode SDj, and the off state of the third transistor element T3*j* corresponds to the non-conducting state of the diode SDj at the time when the voltage difference between the voltage supply line VL and the first control line CLj is smaller than the turn-on voltage of the diode SDj.

In the fourth embodiment also, the initialization voltage VME in the initialization operation is to be supplied from the voltage supply line VL, but a voltage drop corresponding to the turn-on voltage is generated in the diode SDj, so that the voltage provided by adding the turn-on voltage to the initialization voltage VME is applied to the voltage supply line VL during the period of the initialization operation. In other words, the voltage provided by subtracting the turn-on voltage of the diode SDj from the voltage to be applied to the voltage supply line VL is equal to the initialization voltage VME.

The diode SDj needs to be inactivated to set the first control line CLj to the floating state during the period of the writing operation. Thus, in order to inactivate the diode SDj, a voltage which is lower than a voltage provided by adding the turn-on voltage of the diode SDj to a lower limit value in the voltage range (memory voltages (VM0 to VME)) that the first control line CLj can take, is applied to the voltage supply line VL. According to the fourth embodiment, as one example, the writing voltage VW0 is applied to the voltage supply line VL during the period of the writing operation.

In the reading operation, in the case where the switching element SEj has the first type configuration, the reading power supply voltage VSR is supplied to the voltage supply line VL and the third selection voltage VSL3 is applied to the second control line SL to turn on the third transistor element T3*j* in each column so that the reading current Ir is supplied to the first transistor element T1 through the third transistor element T3*j*, while in the case where the switching element SEj has the second type configuration, instead of the above, the reading power supply voltage VSR is only applied to the voltage supply line VL, so that the diode SDj is set to the conducting state, and the reading current Ir is supplied to the first transistor element T1. Therefore, the reading power supply voltage VSR to be applied to the voltage supply line VL needs to be sufficiently high so that the voltage of the first control line CLj (control node Nc) to apply the maximum reading current Ir (=IDS1 (3)) to the diode SDj can operate the first transistor element T1 in the saturation region.

Other Embodiments

Hereinafter, other embodiments will be described.

<1> It has been assumed that the voltage state of the memory node Nm initialized by the initialization operation is allocated to the one data value "3" among the four-value data in the second to fourth embodiments, but in a case where the initialized voltage state is not allocated to one of the four data values "0" to "3", the initialization voltage VME is set to be higher than the four memory voltages VM0 to VM3 corresponding to the data values "0" to "3" as shown in the following formula 8, so that the above-described initialization operation, writing operation, and reading operation can be executed in the same manner. Furthermore, in the writing operation, when the data value "3" is written, the writing voltage VW3 corresponding to the memory voltage VM3 is applied to the data line DL instead of the writing inhibition voltage VIW (initialization voltage VME or higher).

$$VM0<VM1<VM2<VM3<VME \quad \text{(Formula 8)}$$

In addition, a relationship between the writing voltages VW0 to VW3 and the writing inhibition voltage VIW is set to satisfy a relationship shown in the following formula 9 so that the relationship between the memory voltages VM0 to VM3 and the initialization voltage VME satisfies the relationship shown in the formula 8.

$$VW0<VW1<VW2<VW3<VIW \quad \text{(Formula 9)}$$

Furthermore, in the second to fourth embodiments, the description has been given assuming that one of the 2-bit four-value data (0 to 3) is written in or read from the memory cell MC, but the data stored in the memory cell MC is not limited to have the four values, but may have two values, three values, five values, or more values.

<2> In the second embodiment, the detailed description has been given to the case where the initialization operation is performed for the one selected row and then the writing operation is performed by sequentially selecting the data lines DL therein, but as another configuration, the initialization operation may be performed for all of the memory cells MC in the memory cell array MA by the one or more rows, or for all of the rows together, and then the writing operation may be performed by selecting an arbitrary memory cell MC in the memory cell array MA.

<3> According to each of the above embodiments, the first transistor element T1 is the n-channel type MOSFET formed on the silicon substrate, and the second transistor element T2 is the n-channel type thin film transistor (TFT), but the first transistor element T1 may have the same transistor configuration (TFT) as that of the second transistor element T2. In this case, the third or fourth transistor element T3j or T4j used as the switching element SEj also preferably has the same transistor structure (TFT) as that of the second transistor element T2. According to this embodiment, the memory device 20, especially the memory cell array MA can be formed above a logic circuit such as a CPU formed on the silicon substrate 1.

In addition, as long as each of the first to fourth transistor element T1 to T4 is the insulated gate FET, and especially, the second transistor element T2 is the oxide semiconductor insulated gate FET, its transistor structure is not limited to the thin film transistor or the like.

<4> As for the reading operation in the case where the reading circuit 26 is the voltage detection type sense amplifier as described in the second embodiment, the preliminary drive operation to drive the data line DL1 in the selected column (first column) at the reading column voltage VCR equal to or lower than the lowest writing voltage VW0 is performed at the times t6 to t7 shown in the timing chart in FIG. 8, but instead of the preliminary drive operation, a fixed current circuit or a load circuit may be provided between the data line DL1 and a fixed voltage lower than the writing voltage VW0, and the voltage of the data line DL1 may be changed for at least the period of times t7 to t9 so that a fixed current flowing in the fixed current circuit or a load current flowing in the load circuit is balanced with the reading current Ir flowing in the first transistor element T1 corresponding to the memory voltages VM0 to VM2 held in the memory node Nm and the initialization voltage VME (=VM3).

For example, in the case where the constant current circuit is provided, when the constant current flowing in the constant current circuit is set at a reference current Iref shown in the following formula 10, and the drain currents IDS1 (0 to 3) flowing when the first transistor element T1 is operated in the saturation region are balanced with the reference current Iref as shown in following formula 11 to formula 14, respectively, the voltages (source voltages) VDL1 (0 to 3) of the data line DL1 are changed as shown in following formula 15 to formula 18, respectively based on the memory data.

$$Iref = \beta \times (VM0 - Vref - Vt1)^2 / 2$$ (Formula 10)
$$= \beta \times (VW0 - Vref)^2 / 2$$

$$IDS1\ (0) = \beta \times (VM0 - VDL1(0) - Vt1)^2 / 2$$ (Formula 11)
$$= \beta \times (VW0 - VDL1(0))^2 / 2$$
$$= \beta \times (VW0 - Vref)^2 / 2$$

$$IDS1\ (1) = \beta \times (VM1 - VDL1(1) - Vt1)^2 / 2$$ (Formula 12)
$$= \beta \times (VW1 - VDL1(1))^2 / 2$$
$$= \beta \times (VW0 - Vref)^2 / 2$$

$$IDS1\ (2) = \beta \times (VM2 - VDL1(2) - Vt1)^2 / 2$$ (Formula 13)
$$= \beta \times (VW2 - VDL1(2))^2 / 2$$
$$= \beta \times (VW0 - Vref)^2 / 2$$

$$IDS1\ (3) = \beta \times (VME - VDL1(3) - Vt1)^2 / 2$$ (Formula 14)
$$= \beta \times (VW0 - Vref)^2 / 2$$

$$VDL1\ (0) = Vref$$ (Formula 15)

$$VDL1\ (1) = Vref + (VW1 - VW0)$$ (Formula 16)

$$VDL1\ (2) = Vref + (VW2 - VW0)$$ (Formula 17)

$$VDL1\ (3) = Vref + (VME - Vt1 - VW0)$$ (Formula 18)

Therefore, after the voltages (source voltages) VDL1 (0 to 3) of the data line DL1 are changed to the voltages shown in the above formula 15 to formula 18 or their vicinities, one of the memory data "0" to "3" corresponding to the voltage level of the data line DL1 can be read when the voltage detection type sense amplifier (reading circuit 26) detects the inputted voltage level of the data line DL1 selected by the column decoder circuit 22.

Furthermore, in the case where the load circuit is provided between the data line DL1 and the fixed voltage, similarly, when the load current flowing in the load circuit is balanced with the drain currents IDS1 (0 to 3) at the time when the first transistor element T1 is operated in the saturation region, the voltages (source voltages) VDL1 (0 to 3) of the data line DL1 are changed based on the memory data, so that after the voltages are changed, one of the memory data "0" to "3" corresponding to the voltage level of the data line DL1 can be read when the voltage detection type sense amplifier (reading circuit 26) detects the inputted voltage level of the data line DL1 selected by the column decoder circuit 22.

<5> It is assumed that the reading circuit 26 has the circuit configuration in which the reading circuit 26 is connected to the data line DL1 through the column decoder circuit 22 in the second to fourth embodiments, but the reading circuit 26 may be provided beside the voltage supply line VL. In this case, the memory cell array MA is divided into blocks having the same number as the number of the memory cells MC which are read at the same time, and the voltage supply line VL may be provided with respect to each block.

<6> The description has been given to the case where the reading circuit 26 is the voltage detection type sense amplifier or the current detection type sense amplifier in the second to fourth embodiments and the other embodiments, but the reading circuit 26 may have a configuration in which a current detected by the current detection type sense amplifier is converted to a voltage, and then the converted voltage is detected by the voltage detection type sense amplifier.

<7> The description has been given to the case where the data line DLm in the unselected column is driven at the reading inhibition column voltage VIR in the reading operation in the second to fourth embodiments and the other embodiments, but the data line DLm in the unselected column may be set to the floating state instead of being driven at the specific voltage.

<8> The description has been given assuming that the first transistor element T1 included in the memory cell MC is the n-channel thin film transistor in the above embodiments, but the first transistor element T1 may be a p-channel insulated gate FET. However, in the case where the first transistor element T1 is the p-channel type, the directions of the initialization current Ie, the writing current Iw, and the reading current Ir are opposite to the directions of the currents described in the above embodiments. Furthermore, a magnitude relation between the second selection voltage VSL2 and the second non-selection voltage VUS2 applied to the second word line GL is also reversed. Consequently, the directions of the inequality signs in each of the formula 1, formula 2, formula 7, formula 8, and formula 9 are also reversed. The basic idea of the initialization operation, the writing operation, and the reading operation is the same as that in the case of the n-channel type except that the directions of the currents in each operation are reversed, so that its detailed description is omitted. In addition, in the case where the switching element SEj is composed of the diode SDj shown in FIGS. 11A and 11B as descried in the fourth embodiment, the anode electrode of the diode SDj needs to be connected to the first control line CLj, and the cathode electrode thereof needs to be connected to the voltage supply line VL.

Furthermore, similar to the first transistor element T1, the second and third transistor elements T2 and T3 may be the p-channel insulated gate FET. In addition, in the case where the switching element SEj is composed of the diode SDj, and in the case where the diode SDj is composed of the fourth transistor element T4$j$, the fourth transistor element T4$j$ may be the p-channel insulated gate FET.

Figure 12:
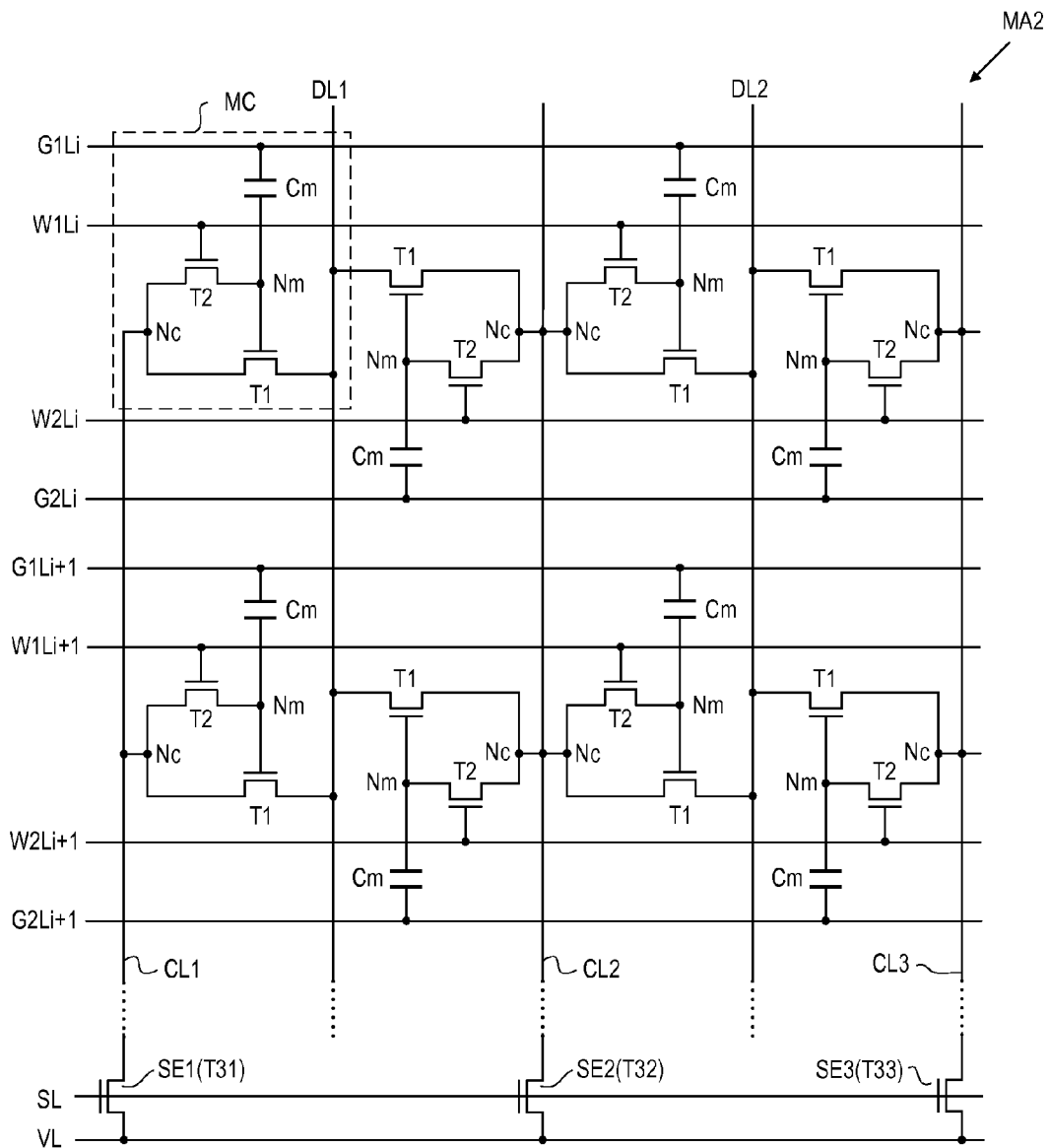
FIG. 12 is an equivalent circuit diagram showing another circuit configuration example of the memory cell array used in the semiconductor memory device in the present invention.
Figure 13:
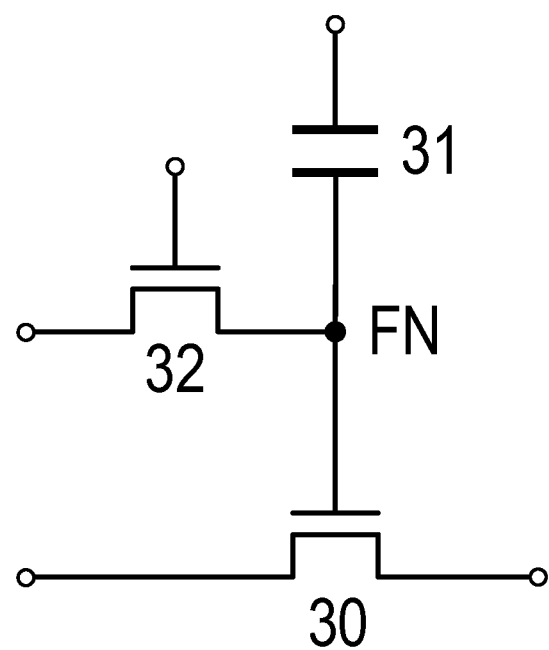
FIG. 13 is an equivalent circuit diagram showing one example of a conventional semiconductor memory circuit composed by having an oxide semiconductor insulated gate FET.

<9> In each of the above embodiments, it has been assumed that the first control line CL is provided in each column, and the control nodes Nc of the memory cells MC arranged in the same column are each connected to the first control line CL, but the one first control line CL may be shared by the memory cells MC in the one column and the memory cells MC in the adjacent column on one side, and the one data line DL may be shared by the memory cells MC in the one column and the memory cells MC in the adjacent column on the other side. However, it is to be noted that in this case, as shown in FIG. 12, the first word line WL is divided into two kinds such as a first word line W1L for the odd number columns and a first word line W2L for the even number columns so that they are respectively connected to the gate electrodes of the second transistors T2 of the two right and left memory cells MC which belong to the same row and share the one first control line CL, and the second word line GL is divided into two kinds such as a second word line G1L for the odd number columns and a second word line G2L for the even number columns so that they are respectively connected to the other ends of the capacitive elements Cm of the two right and left memory cells MC which belong to the same row and share the one data line DL. Thus, each memory operation is not collectively performed for the memory cells MC in the same row belonging to the even number columns and the odd number columns, but each memory operation is divided into two, one for the even number columns and the other for odd number columns and collectively performed for the even number columns and odd number columns, respectively. As a result, the two adjacent memory cells MC can be prevented from interfering with each other.

The configuration of the memory cell array MA2 shown in FIG. 12 can be provided with the two memory cell arrays MA shown in FIG. 3 in such a manner that between the memory cells MC in the j-th column and the (j+1)th column in the one memory cell array MA, the memory cell MC in the j-th column in the other memory cell array MA is interposed, the first control line CL is shared by the memory cells MC in the j-th column in the one memory cell array MA and in the j-th column in the other memory cell array MA, the data line DL is shared by the memory cells MC in the (j+1)th column in the one memory cell array MA and in the j-th column in the other memory cell array MA, and the first and second word lines WL and GL for driving the one memory cell array MA, and the first and second word lines WL and GL for driving the other memory cell array MA are independently provided. Furthermore, from a viewpoint of the arrangement of the rows, the configuration of the memory cell array MA2 shown in FIG. 12 is equivalently provided in such a manner that between the memory cells MC in the i-th row and the (i+1)th row in the one memory cell array MA, the memory cell MC in the i-th row in the other memory cell array MA is interposed, and the rows of the one and the other memory cell arrays MA are independently provided.

EXPLANATION OF REFERENCES

1 Silicon substrate
2 Drain region of first transistor element
3 Source region of first transistor element
4 First gate insulating film
5 Gate of first transistor element
6 Insulating film
7 Oxide semiconductor: first active region (channel region)
8 Oxide semiconductor: second active region
9 First metal electrode (drain region of second transistor element)
10 Second metal electrode (source region of second transistor element)
11 Second gate insulating film
12 Gate of second transistor element
13 Third gate insulating film
14 Electrode
15 Contact metal
20 Memory device (semiconductor memory device)
21 Control circuit
22 Column decoder circuit
23 Data line drive circuit
24 First row decoder circuit
25 Second row decoder circuit
26 Reading circuit
ADD Address signal
CA Column address signal
CNTL Control signal
CL (CL1, CL2, . . . , CLm) First control line
Cm Capacitive element
DIN Data input signal
DL (DL1, DL2, . . . , DLm) Data line (data signal line)
DOUT Data output signal
GL (GL1, GL2, . . . , GLn) Second word line (second selection line)
MA, MA2 Memory cell array
MC Memory cell
Nc Control node
Nm Memory node
RA Row address signal
RD Detected information
SD Diode (switching element)

SE Switching element
SL Second control line
T1 First transistor element
T2 Second transistor element
T3 Third transistor element (switching element)
T4 Fourth transistor element (switching element)
VL Voltage supply line
WL (WL1, WL2, WLn) First word line (first selection line)

The invention claimed is:

1. A semiconductor memory device comprising a memory cell array in which a plurality of memory cells each having a first transistor element composed of an insulated gate FET, a second transistor element composed of an oxide semiconductor insulated gate FET, and a capacitive element are arranged at least in a column direction, wherein
    each of the memory cells includes a memory node formed at a connection point of a gate electrode of the first transistor element, a source electrode of the second transistor element, and one end of the capacitive element, and a control node formed at a connection point of a drain electrode of the first transistor element and a drain electrode of the second transistor element,
    each of the memory cells arranged in respective rows belonging to the same column includes the control node connected to a first control line shared in the same column and extending in the column direction, the first transistor element having a source electrode connected to a data signal line shared in the same column and extending in the column direction, the second transistor element having a gate electrode connected individually to a first selection line, and the capacitive element having the other end connected individually to a second selection line,
    a switching element having one end connected to the first control line, and the other end connected to a voltage supply line is provided with respect to each first control line, and
    the switching element is turned on to drive the first control line in an initialization operation to initialize a voltage state of the memory node, and in a reading operation to read the voltage state of the memory node, and turned off to set the first control line to a floating state in a writing operation to write a memory voltage in the memory node.

2. The semiconductor memory device according to claim 1, wherein
    the memory cell array has the plurality of the memory cells in each of the column direction and a row direction,
    each of the memory cells arranged in the same row includes the second transistor element having the gate electrode connected to the first selection line shared in the same row and extending in the row direction, and the capacitive element having the other end connected to the second selection line shared in the same row and extending in the row direction, and
    the one end of the switching element which is one of the same number of switching elements as first control lines is connected to the first control line which is corresponding one of the first control lines, respectively.

3. The semiconductor memory device according to claim 1, wherein
    the switching element is one of a third transistor element composed of an insulated gate FET having a gate electrode connected to the second control line, a drain electrode connected to the voltage supply line, and a source electrode connected to the first control line, a fourth transistor element composed of an insulated gate FET having a gate electrode and a drain electrode both connected to the voltage supply line, and a source electrode connected to the first control line, and a diode element in which one of an anode terminal and a cathode terminal is connected to the voltage supply line, and the other is connected to the first control line.

4. The semiconductor memory device according to claim 1, wherein
    each of the first and second transistor elements is a thin film transistor element.

5. The semiconductor memory device according to claim 1, wherein
    the first transistor element is a transistor element formed on a semiconductor substrate, and
    the second transistor element is a thin film transistor element formed so as to be stacked above the first transistor element.

6. The semiconductor memory device according to claim 1, wherein
    the second transistor element is made of oxide semiconductor of InGaZnO.

7. The semiconductor memory device according to claim 1, wherein
    the semiconductor memory device is configured so that, in the initialization operation,
    a first selection voltage and a second selection voltage are respectively applied to the first selection line and the second selection line connected to the memory cells in at least one selected row selected as a target of the initialization operation, to turn on the second transistor element,
    an initialization auxiliary voltage is applied to the data signal line connected to the memory cells selected as the target of the initialization operation to forcibly turn off the first transistor element, and
    a predetermined initialization voltage is written from the voltage supply line to the memory node of the memory cells selected as the target of the initialization operation through the switching element and the second transistor element both turned on.

8. The semiconductor memory device according to claim 1, wherein
    the semiconductor memory device is configured so that, in the writing operation for at least one of the memory cells in which the voltage state of the memory node has been initialized,
    a first selection voltage and a second selection voltage are respectively applied to the first selection line and the second selection line connected to the memory cells in one selected row selected as a target of the writing operation, to turn on the first and second transistor elements,
    a first non-selection voltage and a second non-selection voltage are respectively applied to the first selection line and the second selection line connected to the memory cells in an unselected row not selected as the target of the writing operation, to turn off the first and second transistor elements,
    a writing voltage corresponding to data to be stored is individually applied to the data signal line connected to the memory cells in at least one selected column selected as the target of the writing operation, and
    the memory voltage having a constant relationship with the writing voltage is written from the data signal line connected to the memory cells in the selected column to the memory node of each of the memory cells selected as the target of the writing operation through the first and second transistor elements both turned on.

9. The semiconductor memory device according to claim 8, wherein
the semiconductor memory device is configured so that a writing inhibition voltage is applied to the data signal line connected to the memory cells in an unselected column not selected as the target of the writing operation, to turn off the first transistor element.

10. The semiconductor memory device according to claim 1, wherein
the semiconductor memory device is configured so that after the writing operation, a first non-selection voltage is applied to the first selection line to turn off the second transistor element, and set the memory node to a floating state, and the memory voltage written in the memory node is continuously held.

11. The semiconductor memory device according to claim 1, wherein
the semiconductor memory device is configured so that in the reading operation,
a first non-selection voltage is applied to the first selection lines in all of the rows to turn off the second transistor elements of the memory cells in the rows,
the second selection voltage is applied to the second selection line connected to the memory cells in one selected row selected as a target of the reading operation, and the voltage state of the memory node of each of the memory cells in the selected row becomes the memory voltage written in the writing operation,
a second non-selection voltage is applied to the second selection line connected to the memory cells in an unselected row not selected as the target of the reading operation, and the voltage state of the memory node of each of the memory cells not selected as the target of the reading operation is inactivated to forcibly turn off the first transistor element, and
a reading voltage or a reading current corresponding to the voltage state of the memory node of each of the memory cells in the corresponding selected column in the selected row is outputted to the data signal line in at least one selected column selected as the target of the reading operation.

12. The semiconductor memory device according to claim 11, wherein
the semiconductor memory device is configured so that a reading inhibition voltage to turn off the first transistor element is applied to the data signal line connected to the memory cells in the unselected column not selected as the target of the reading operation, or any voltage is not applied to the data signal line to set the first transistor element to the floating state for the memory cells in the unselected column.

13. The semiconductor memory device according to claim 1 comprising:
a data signal line drive circuit for individually driving the data signal line;
a first selection line drive circuit for individually driving the first selection line;
a second selection line drive circuit for individually driving the second selection line;
a switching element control circuit for turning on or off the switching element; and
a reading circuit for detecting a reading voltage or a reading current outputted to the data signal line based on the memory voltage stored in the memory node.

* * * * *